US012046519B2

(12) United States Patent
Lee et al.

(10) Patent No.: US 12,046,519 B2
(45) Date of Patent: *Jul. 23, 2024

(54) METAL GATES AND METHODS OF FORMING THEREBY

(71) Applicant: Taiwan Semiconductor Manufacturing Co., Ltd., Hsinchu (TW)

(72) Inventors: Hsin-Yi Lee, Hsinchu (TW); Cheng-Lung Hung, Hsinchu (TW); Chi On Chui, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/882,165

(22) Filed: Aug. 5, 2022

(65) Prior Publication Data

US 2022/0375798 A1 Nov. 24, 2022

Related U.S. Application Data

(63) Continuation of application No. 17/018,084, filed on Sep. 11, 2020, now Pat. No. 11,488,873.

(60) Provisional application No. 63/042,313, filed on Jun. 22, 2020.

(51) Int. Cl.
*H01L 21/8238* (2006.01)
*H01L 21/285* (2006.01)
*H01L 27/092* (2006.01)
*H01L 29/49* (2006.01)

(52) U.S. Cl.
CPC .. *H01L 21/823842* (2013.01); *H01L 27/0924* (2013.01); *H01L 29/4966* (2013.01); *H01L 21/28568* (2013.01)

(58) Field of Classification Search
CPC ....... H01L 21/823842; H01L 21/28568; H01L 27/0924; H01L 29/4966
See application file for complete search history.

(56) References Cited

U.S. PATENT DOCUMENTS

| 6,773,978 B1 | 10/2004 | Besser et al. |
| 11,488,873 B2 * | 11/2022 | Lee ................. H01L 21/823842 |
| 2011/0215409 A1 | 9/2011 | Li et al. |
| 2015/0061042 A1 | 3/2015 | Cheng et al. |

(Continued)

FOREIGN PATENT DOCUMENTS

| DE | 102019112394 A1 | 11/2020 |
| KR | 20190053068 A | 5/2019 |

(Continued)

*Primary Examiner* — Christine A Enad
(74) *Attorney, Agent, or Firm* — Slater Matsil, LLP

(57) ABSTRACT

A method includes depositing a first conductive layer over a gate dielectric layer; depositing a first work function tuning layer over the first conductive layer; selectively removing the first work function tuning layer from over a first region of the first conductive layer; doping the first work function tuning layer with a dopant; and after doping the first work function tuning layer performing a first treatment process to etch the first region of the first conductive layer and a second region of the first work function tuning layer. The first treatment process etches the first conductive layer at a greater rate than the first work function tuning layer.

20 Claims, 20 Drawing Sheets

(56) References Cited

U.S. PATENT DOCUMENTS

| | | |
|---|---|---|
| 2016/0276224 A1 | 9/2016 | Gan et al. |
| 2017/0221889 A1* | 8/2017 | Dasgupta ............ H01L 29/4958 |
| 2018/0122701 A1 | 5/2018 | Li |
| 2019/0067302 A1 | 2/2019 | Wu et al. |
| 2019/0165113 A1 | 5/2019 | Lin et al. |
| 2019/0311953 A1* | 10/2019 | Cho .................... H01L 29/4966 |
| 2019/0371675 A1 | 12/2019 | Tsai et al. |
| 2019/0375675 A1 | 12/2019 | Liang et al. |
| 2020/0135588 A1 | 4/2020 | Wu et al. |
| 2020/0161443 A1 | 5/2020 | Lee et al. |
| 2020/0350414 A1 | 11/2020 | Lee et al. |
| 2021/0217846 A1 | 7/2021 | Hashemi et al. |
| 2022/0254687 A1 | 8/2022 | Cheng et al. |

FOREIGN PATENT DOCUMENTS

| | | |
|---|---|---|
| KR | 20190118269 A | 10/2019 |
| KR | 20200005418 A | 1/2020 |

\* cited by examiner

METAL GATES AND METHODS OF FORMING THEREBY

PRIORITY CLAIM AND CROSS-REFERENCE

This application is a continuation of U.S. application Ser. No. 17/018,084, filed on Sep. 11, 2020, which claims the benefit of U.S. Provisional Application No. 63/042,313, filed on Jun. 22, 2020, which applications are hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
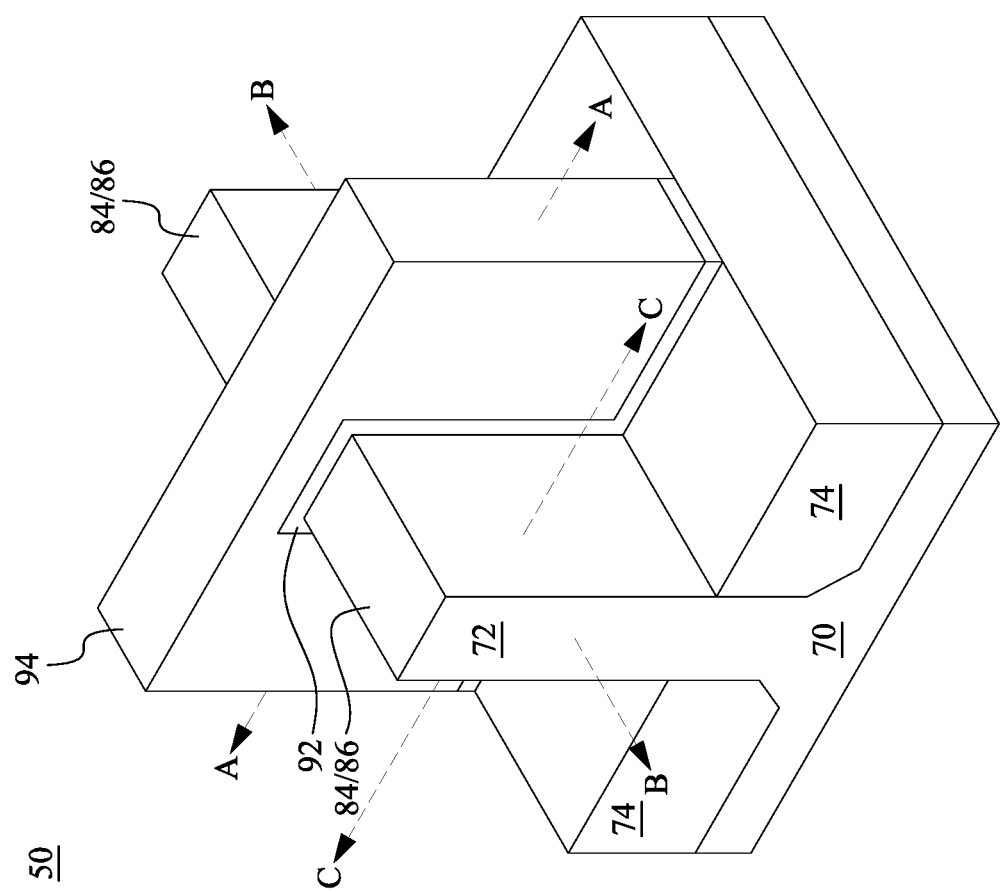
FIG. 1 is an example of a fin Field-Effect Transistor (finFET) in a three-dimensional view in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments provide a gate electrode with a doped work function tuning layer (e.g., a titanium nitride layer). The work function tuning layer may be doped with, for example, silicon, aluminum, or the like, and the work function tuning layer may further include oxygen bonded to the dopant (e.g., $Si_xO_y$, $Al_xO_y$, or the like). By adjusting the composition of the work function tuning layer, etch selectivity between the work function tuning layer and an underlying layer (e.g., a tantalum nitride layer) maybe increased during a chlorine-based treatment that reduces thicknesses of the underlying layer for threshold voltage tuning. In this manner, a greater differential between threshold voltages of different transistors in the device can be achieved.

FIG. 1 illustrates an example of a FinFET in a three-dimensional view, in accordance with some embodiments. The FinFET comprises a fin 72 on a substrate 70 (e.g., a semiconductor substrate). Isolation regions 74 are disposed in the substrate 70, and the fin 72 protrudes above and from between neighboring isolation regions 74. Although the isolation regions 74 are described/illustrated as being separate from the substrate 70, as used herein the term "substrate" may be used to refer to just the semiconductor substrate or a semiconductor substrate inclusive of isolation regions. Additionally, although the fin 72 is illustrated as a single, continuous material as the substrate 70, the fin 72 and/or the substrate 70 may comprise a single material or a plurality of materials. In this context, the fin 72 refers to the portion extending between the neighboring isolation regions 74.

A gate dielectric layer 92 is along sidewalls and over a top surface of the fin 72, and a gate electrode 120 is over the gate dielectric layer 92. Source/drain regions 84 or 86 are disposed in opposite sides of the fin 72 with respect to the gate dielectric layer 92 and gate electrode 120. FIG. 1 further illustrates reference cross-sections that are used in later figures. Cross-section A-A is along a longitudinal axis of the gate electrode 120 and in a direction, for example, perpendicular to the direction of current flow between the source/drain regions 84/86 of the FinFET. Cross-section B-B is perpendicular to cross-section A-A and is along a longitudinal axis of the fin 72 and in a direction of, for example, a current flow between the source/drain regions 84/86 of the FinFET. Cross-section C-C is parallel to cross-section A-A and extends through a source/drain region of the FinFET. Subsequent figures refer to these reference cross-sections for clarity.

Some embodiments discussed herein are discussed in the context of FinFETs formed using a gate-last process. In other embodiments, a gate-first process may be used. Also, some embodiments contemplate aspects used in planar devices, such as planar FETs, nanostructure (e.g., nanosheet, nanowire, gate-all-around, or the like) field effect transistors (NSFETs), or the like.

FIGS. 2 through 15C are cross-sectional views of intermediate stages in the manufacturing of finFETs in accordance with an exemplary embodiment. FIGS. 2, 3, 4A, 5A, and 15A illustrate reference cross-section A-A illustrated in FIG. 1, except for multiple fins. FIGS. 4B, 5B, 6A, 7 through 14, and 15B illustrate reference cross-section B-B illustrated in FIG. 1, except for multiple finFETs. FIGS. 6B, 6C, and 15C illustrate reference cross-section C-C illustrated in FIG. 1, except for multiple finFETs.

Figure 2:
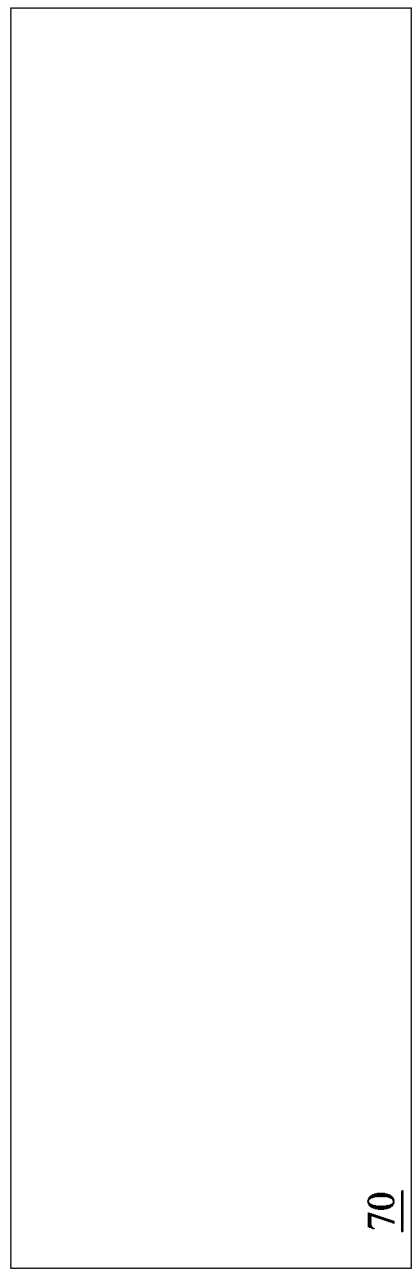
FIGS. 2, 3, 4A, 4B, 5A, 5B, 6A, 6B, 6C, 7, 8, 9, 10, 11, 12, 13, 14, 15A, 15B, and 15C are cross-sectional views of intermediate stages in the manufacturing of finFETs in accordance with some embodiments.

FIG. 2 illustrates a substrate 70. The substrate 70 may be a semiconductor substrate, such as a bulk semiconductor substrate, a semiconductor-on-insulator (SOI) substrate, a multi-layered or gradient substrate, or the like. The substrate 70 may include a semiconductor material, such as an elemental semiconductor including Si and Ge; a compound or alloy semiconductor including SiC, SiGe, GaAs, GaP, GaAsP, AlInAs, AlGaAs, GaInAs, InAs, GaInP, InP, InSb, and/or GaInAsP; or a combination thereof. The substrate 70 may be doped or un-doped. In a specific example, the substrate 70 is a bulk silicon substrate.

Figure 3:
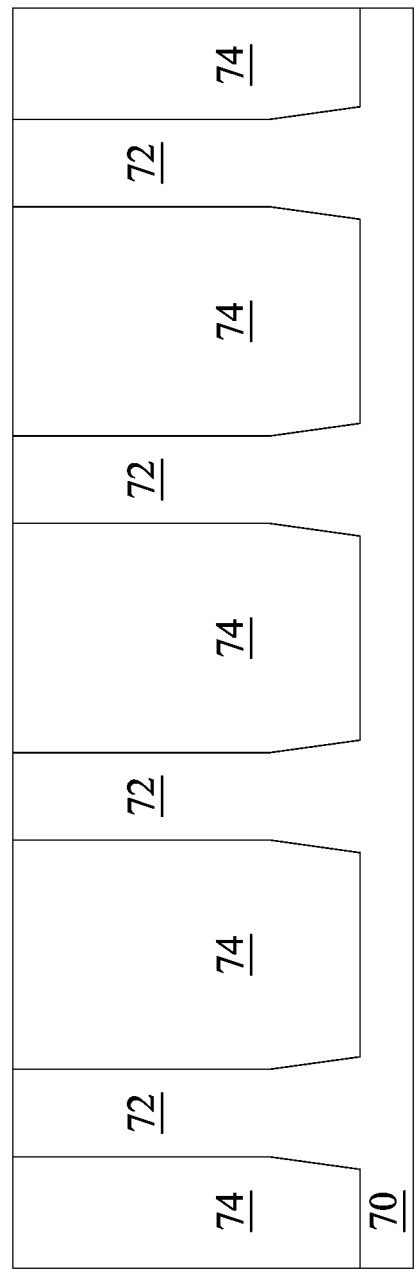

FIG. 3 illustrates the formation of fins 72 and isolation regions 74 between neighboring fins 72. In FIG. 3, fins 72 are formed in the substrate 70. In some embodiments, the fins 72 may be formed in the substrate 70 by etching trenches in the substrate 70. The etching may be any acceptable etch process, such as a reactive ion etch (RIE), neutral beam etch (NBE), the like, or a combination thereof. The etch may be anisotropic.

Further in FIG. 3, an insulation material is formed between neighboring fins 72 to form the isolation regions 74. The insulation material may be an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials formed by any acceptable process may be used. In the illustrated embodiment, the insulation material is silicon oxide formed by a FCVD process. An anneal process may be performed once the insulation material is formed. Further in FIG. 3, a planarization process, such as a chemical mechanical polish (CMP), may remove any excess insulation material and form top surfaces of the isolation regions 74 and top surfaces of the fins 72 that are co-planar.

Although not specifically illustrated, appropriate wells may be formed in the fins 72 and/or substrate 70. For example, an n-well may be formed in a first region 200 and a fourth region 500 (illustrated in FIG. 4B and subsequent figures) of the substrate 70 where p-type devices, such as p-type finFETs, are to be formed, and a p-well may be formed in a second region 300 and a third region 400 of the substrate 70 (illustrated in FIG. 4B and subsequent figures) where n-type devices, such as n-type finFETs, are to be formed.

For example, to form an n-well in the first region 200 and the fourth region 500, a photoresist can be formed over the fins 72 and the isolation regions 74 in the second region 300 and the third region 400 of the substrate 70. The photoresist can be patterned to expose the first region 200 and the fourth region 500 of the substrate 70. The photoresist can be formed by using a spin-on technique and can be patterned using acceptable photolithography techniques. Once the photoresist is patterned, an n-type impurity implant can be performed in the first region 200 and the fourth region 500, and the photoresist may act as a mask to substantially prevent p-type impurities from being implanted into the second region 300 and the third region 400. The n-type impurities may be phosphorus, arsenic, or the like implanted in the first region 200 and the fourth region 500 to a concentration of equal to or less than $10^{18}$ cm$^{-3}$, such as between about $10^{17}$ cm$^{-3}$ and about $10^{18}$ cm$^{-3}$. After the implant, the photoresist can be removed, such as by an acceptable ashing process.

Further, to form a p-well in the second region 300 and the third region 400, a photoresist can be formed over the fins 72 and the isolation regions 74 in the first region 200 and the fourth region 500 of the substrate. The photoresist can be patterned to expose the second region 300 and the third region 400 of the substrate 70. The photoresist can be formed by using a spin-on technique and can be patterned using acceptable photolithography techniques. Once the photoresist is patterned, a p-type impurity implant may be performed in the second region 300 and the third region 400, and the photoresist may act as a mask to substantially prevent p-type impurities from being implanted into the first region 200 and the fourth region 500. The p-type impurities may be boron, BF$_2$, or the like implanted in the second region 300 and the third region 400 to a concentration of equal to or less than $10^{18}$ cm$^{-3}$, such as between about $10^{17}$ cm$^{-3}$ and about $10^{18}$ cm$^{-3}$. After the implant, the photoresist can be removed, such as by an acceptable ashing process. After the implants, an anneal may be performed to activate the p-type and n-type impurities that were implanted. The implantations may form an n-well in the first region 200 and the fourth region 400 and a p-well in the second region 300 and the third region 400.

Figure 4A:
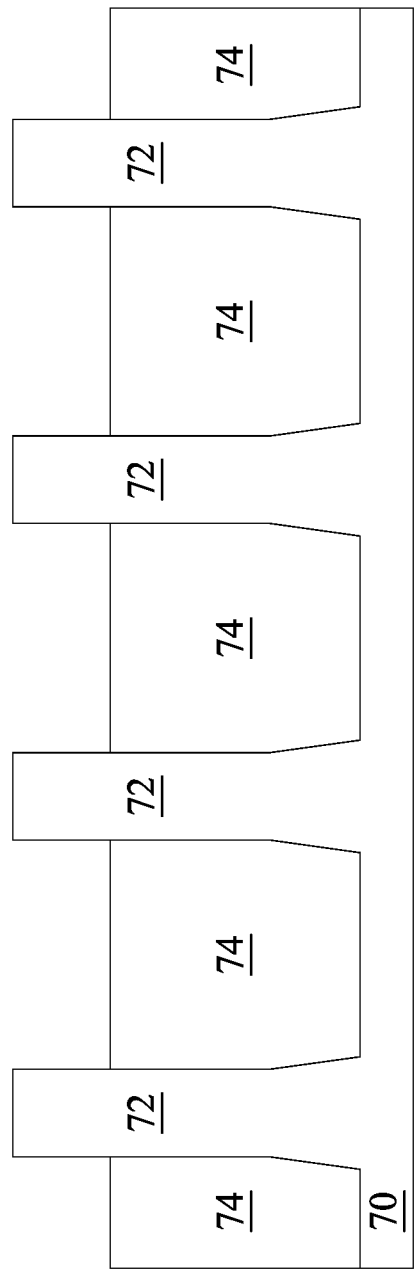
Figure 4B:
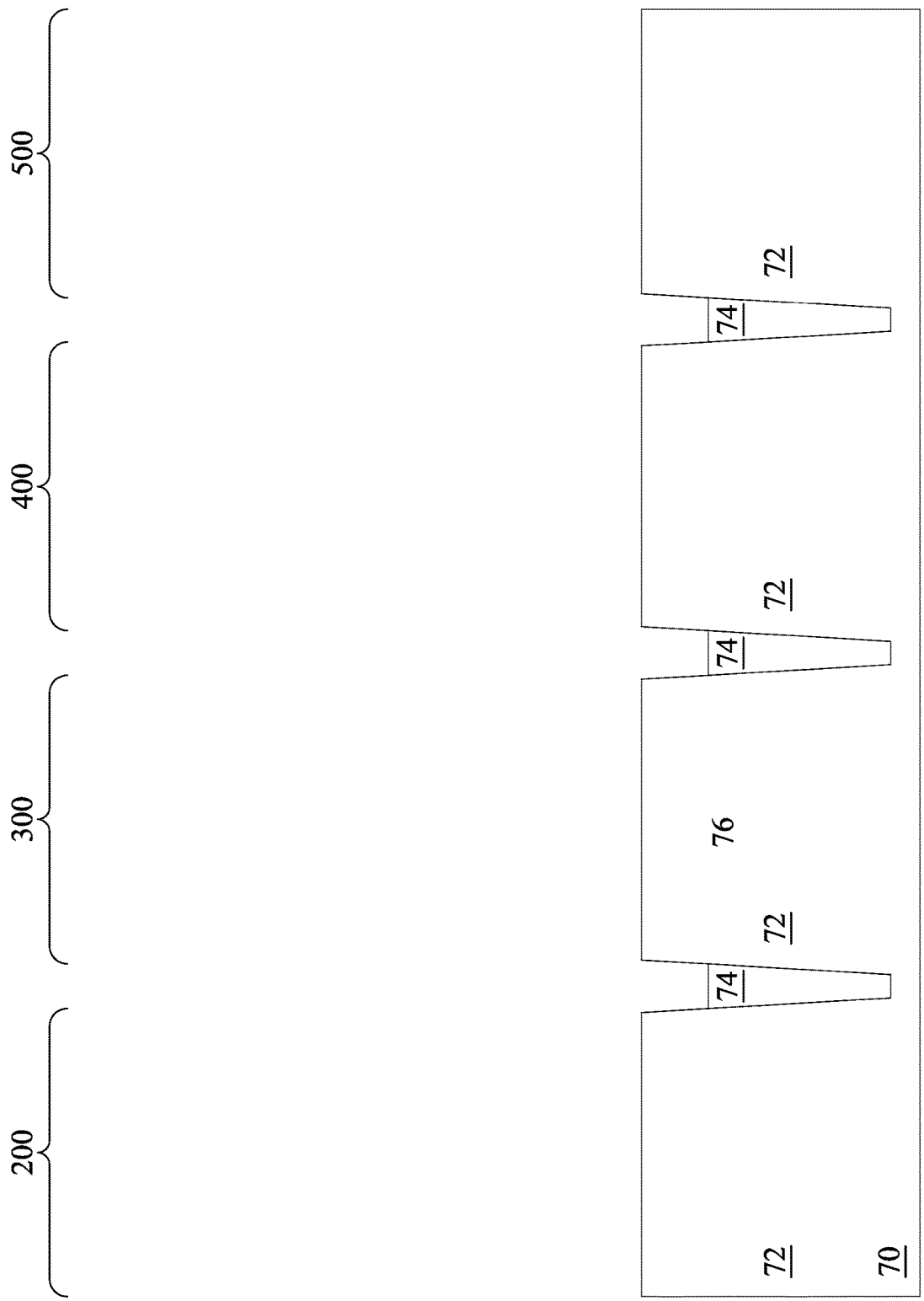

In FIGS. 4A and 4B, the isolation regions 74 are recessed, such as to form Shallow Trench Isolation (STI) regions. The isolation regions 74 are recessed such that fins 72 protrude from between neighboring isolation regions 74. The isolation regions 74 may be recessed using an acceptable etching process, such as one that is selective to the material of the isolation regions 74. For example, a chemical oxide removal using a CERTAS® etch or an Applied Materials SICONI tool or dilute hydrofluoric (dHF) acid may be used.

A person having ordinary skill in the art will readily understand that the process described with respect to FIGS. 2, 3, 4A, and 4B is just one example of how fins may be formed. In other embodiments, a dielectric layer can be formed over a top surface of the substrate 70; trenches can be etched through the dielectric layer; epitaxial fins can be epitaxially grown in the trenches; and the dielectric layer can be recessed such that the homoepitaxial and/or heteroepitaxial structures protrude from the dielectric layer to form epitaxial fins. It may be advantageous to epitaxially grow a material or epitaxial fin structure for n-type finFETs different from the material or epitaxial fin structure for p-type finFETs.

Figure 5A:
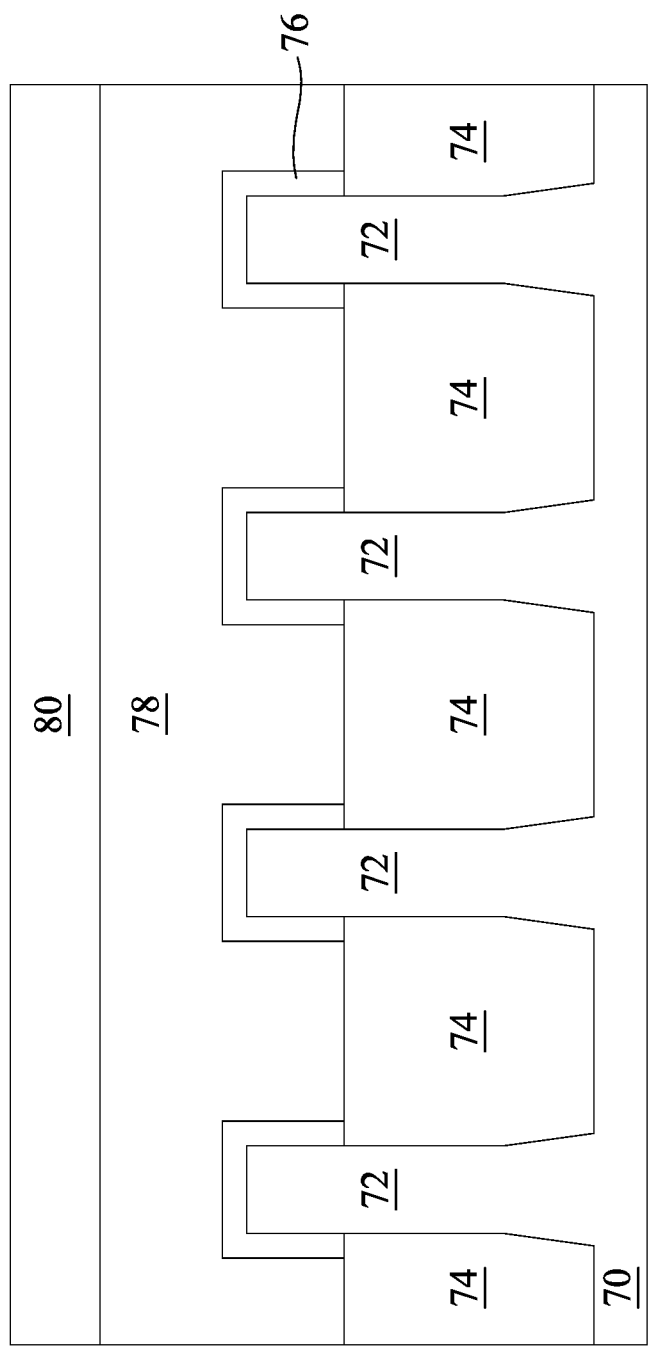
Figure 5B:
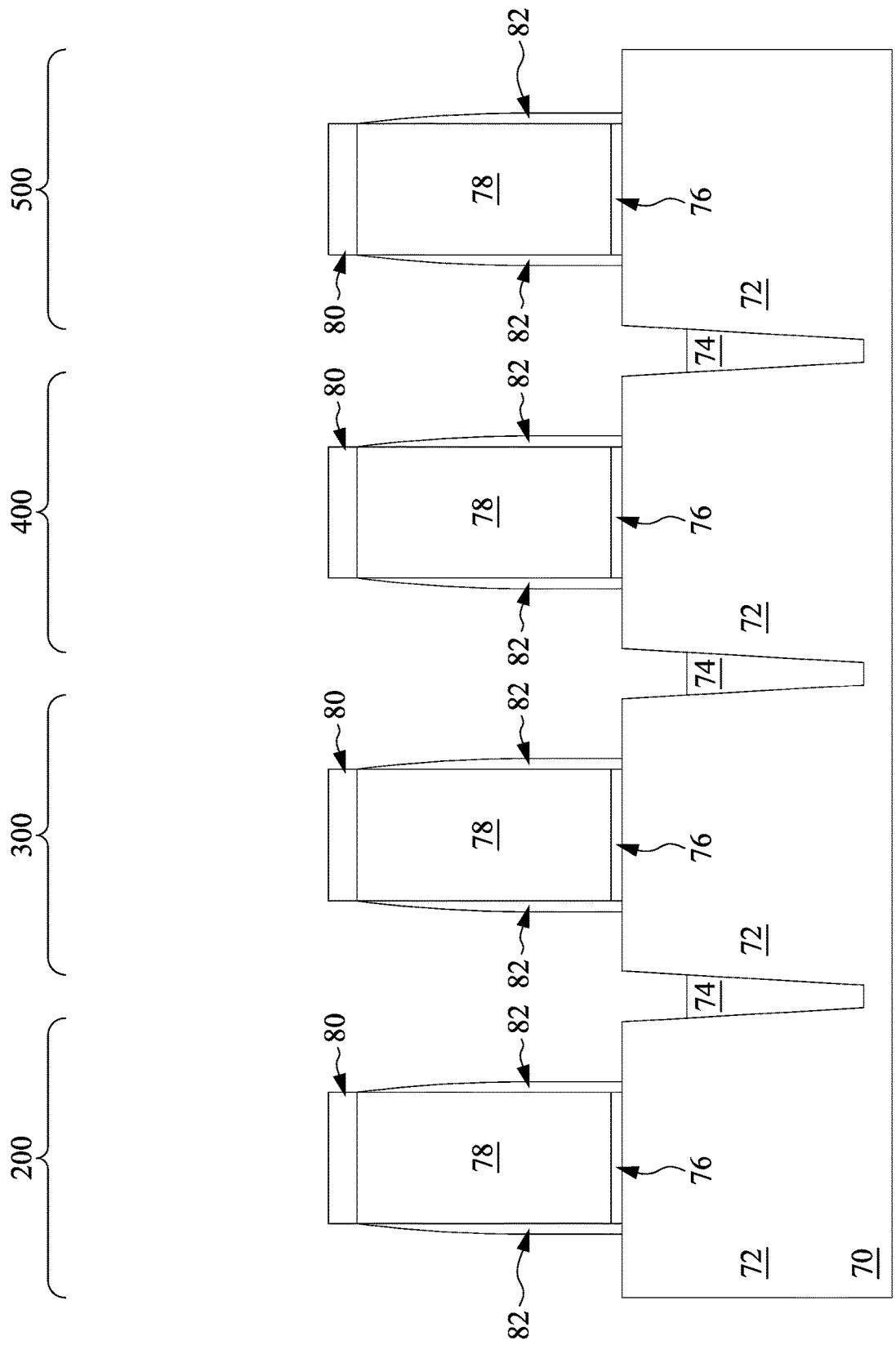

In FIGS. 5A and 5B, a dummy dielectric layer is formed on the fins 72. The dummy dielectric layer may be, for example, silicon oxide, silicon nitride, a combination thereof, or the like, and may be deposited or thermally grown according to acceptable techniques, such as Chemical Vapor Deposition (CVD), thermal oxidation, or the like. A dummy gate layer is formed over the dummy dielectric layer, and a mask layer is formed over the dummy gate layer. The dummy gate layer may be deposited, such as by using CVD or the like, over the dummy dielectric layer and then planarized, such as by a CMP. The mask layer may be deposited, such as by using CVD or the like, over the dummy gate layer. The dummy gate layer may comprise, for example, polysilicon, although other materials that have a high etching selectivity may also be used. The mask layer may comprise, for example, silicon nitride, silicon oxynitride, silicon carbon nitride, or the like.

Further in FIGS. 5A and 5B, the mask layer may be patterned using acceptable photolithography and etching techniques to form masks 80. The pattern of the masks 80 then may be transferred to the dummy gate layer and the dummy dielectric layer by an acceptable etching technique to form dummy gates 78 and dummy gate dielectrics 76 from the dummy gate layer and the dummy dielectric layer, respectively. The etching may comprise an acceptable anisotropic etching, such as RIE, NBE, or the like. The dummy gates 78 cover respective channel regions of the fins 72. The dummy gates 78 may also have a lengthwise direction substantially perpendicular to the lengthwise direction of respective fins 72.

Although not specifically illustrated, implants for lightly doped source/drain (LDD) regions may be performed. Similar to the implants discussed above, a mask, such as a photoresist, may be formed over the second region 300 and the third region 400, e.g., for n-type devices, while exposing the first region 200 and the fourth region 500, e.g., for p-type devices, and p-type impurities may be implanted into the exposed fins 72 in the first region 200 and the fourth region 500. The mask may then be removed. Subsequently, a mask, such as a photoresist, may be formed over the first region 200 and the fourth region 500 while exposing the second region 300 and the third region 400, and n-type impurities may be implanted into the exposed fins 72 in the second region 300 and the third region 400. The mask may then be removed. The n-type impurities may be any of the n-type impurities previously discussed, and the p-type impurities may be any of the p-type impurities previously discussed. The lightly doped source/drain regions may have a concentration of impurities from about $10^{15}$ cm$^{-3}$ to about $10^{16}$ cm$^{-3}$. An anneal may be used to activate the implanted impurities.

Further in FIGS. 5A and 5B, gate spacers 82 are formed along sidewalls of the dummy gates 78 and dummy gate dielectrics 76. The gate spacers 82 may be formed by conformally depositing, such as by CVD or the like, a material and subsequently anisotropically etching, such as RIE, NBE, or the like, the material. The material of the gate spacers 82 may be silicon nitride, silicon carbon nitride, a combination thereof, or the like.

Figure 6A:
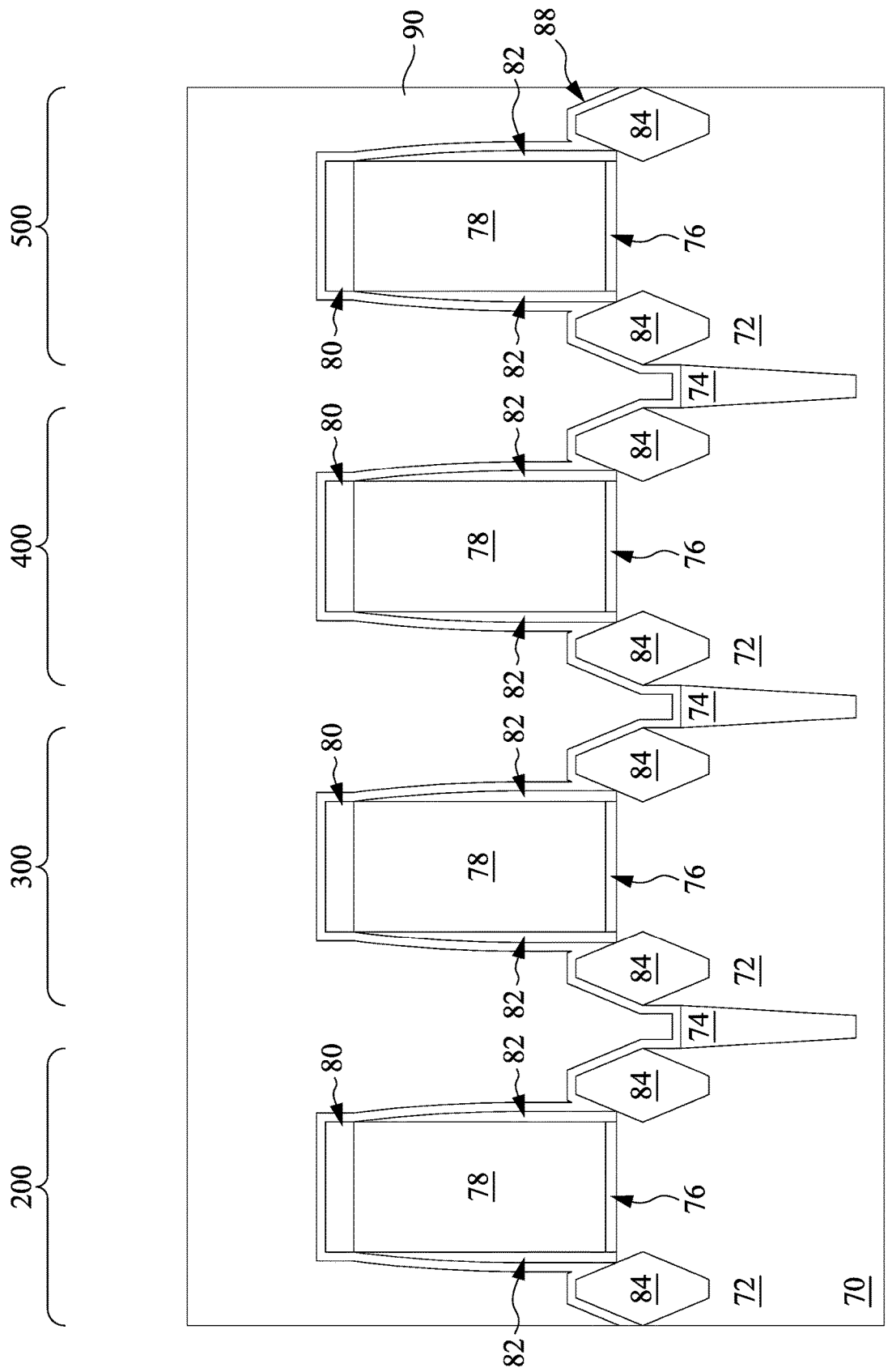
Figure 6C:
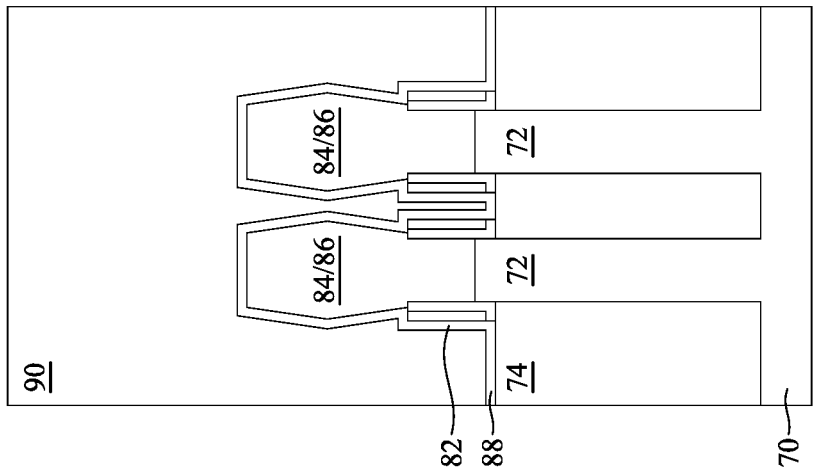
Figure 6B:
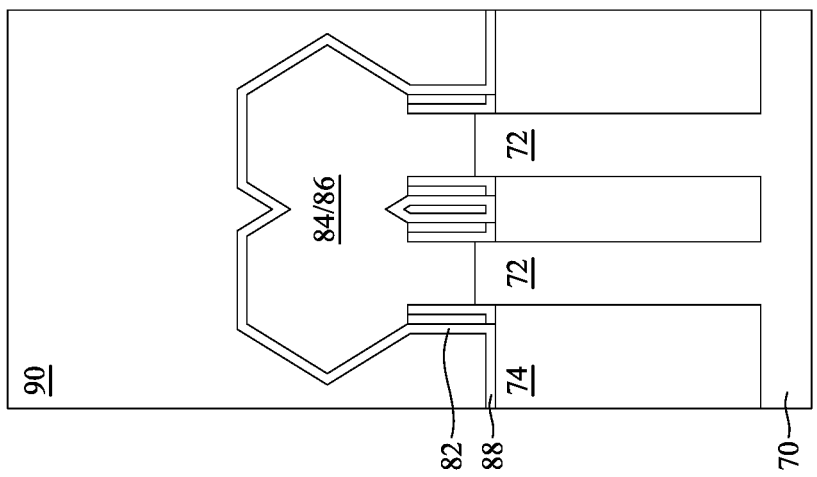

In FIGS. 6A, 6B, and 6C, epitaxial source/drain regions 84 and 86 are formed in the source/drain region of the fins 72. In the first region 200 and the fourth region 500, epitaxial source/drain regions 84 are formed in the source/drain regions of the fins 72 such that each dummy gate 78 is disposed between ones of a respective pair of the epitaxial source/drain regions 84 in each fin 72. In the second region 300 and the third region 400, epitaxial source/drain regions 86 are formed in the source/drain regions of the fins 72 such that each dummy gate 78 is disposed between ones of a respective pair of the epitaxial source/drain regions 86 in each fin 72.

The epitaxial source/drain regions 84 in the first region 200 and the fourth region 500, e.g., for p-type devices, may be formed by masking, such as with a hard mask, the second region 300 and the third region 400, e.g., for n-type devices. Then, source/drain regions of the fins 72 in the first region 200 and the fourth region 500 are etched to form recesses. The etch may be any appropriate etch selective to the fins 72 and may be anisotropic. The epitaxial source/drain regions 84 in the first region 200 and the fourth region 500 are then epitaxially grown in the recesses. The epitaxial growth may be by using Metal-Organic CVD (MOCVD), Molecular Beam Epitaxy (MBE), Liquid Phase Epitaxy (LPE), Vapor Phase Epitaxy (VPE), the like, or a combination thereof. The epitaxial source/drain regions 84 may comprise any acceptable material, such as appropriate for p-type finFETs. For example, the epitaxial source/drain regions 84 may comprise SiGe, SiGeB, Ge, GeSn, or the like. In some embodiments, the epitaxial source/drain regions 84 may exert a compressive strain on channel regions of the fins 72, thereby improving p-type device performance. The epitaxial source/drain regions 84 may have surfaces raised from respective outer surfaces of the fins 72 and may have facets. The mask may then be removed, such as by using an etch selective to the material of the mask.

The epitaxial source/drain regions 86 in the second region 300 and the third region 400 may be formed by masking, such as with a hard mask, the first region 200 and the fourth region 500. Then, source/drain regions of the fins 72 in the second region 300 and the third region 400 are etched to form recesses. The etch may be any appropriate etch selective to the fins 72 and may be anisotropic. The epitaxial source/drain regions 86 in the second region 300 and the third region 400 are then epitaxially grown in the recesses. The epitaxial growth may be by using MOCVD, MBE, LPE, VPE, the like, or a combination thereof. The epitaxial source/drain regions 86 may comprise any acceptable material, such as appropriate for n-type finFETs. For example, the epitaxial source/drain regions 86 may comprise silicon, SiC, SiCP, SiP, or the like. n some embodiments, the epitaxial source/drain regions 86 may exert a tensile strain on channel regions of the fins 72, thereby improving n-type device performance. The epitaxial source/drain regions 86 may have surfaces raised from respective outer surfaces of the fins 72 and may have facets. The mask may then be removed, such as by using an etch selective to the material of the mask.

The epitaxial source/drain regions 84 and 86 and/or source/drain regions of the fins 72 may be implanted with dopants, similar to the process previously discussed for forming lightly doped source/drain regions, followed by an anneal. The source/drain regions may have an impurity concentration of between about $10^{19}$ cm$^{-3}$ and about $10^{21}$ cm$^{-3}$. The p-type impurities for source/drain regions in the first region 200 and the fourth region 500, e.g., for p-type devices, may be any of the p-type impurities previously discussed, and the n-type impurities for source/drain regions in the second region 300 and the third region 400, e.g., for n-type devices, may be any of the n-type impurities previously discussed. In other embodiments, the epitaxial source/drain regions 84 and 86 may be in situ doped during growth.

As a result of the epitaxy processes used to form the epitaxial source/drain regions 84 and 86, upper surfaces of the epitaxial source/drain regions 84/86 have facets which expand laterally outward beyond sidewalls of the fins 52. In some embodiments, these facets cause adjacent source/drain regions 84/86 of a same FinFET to merge as illustrated by FIG. 6B. In other embodiments, adjacent source/drain regions 84/86 remain separated after the epitaxy process is completed as illustrated by FIG. 6C. In the embodiments illustrated in FIGS. 6B and 6C, gate spacers 82 are formed covering a portion of the sidewalls of the fins 72 that extend above the STI regions 76 thereby blocking the epitaxial growth. In some other embodiments, the spacer etch used to form the gate spacers 82 may be adjusted to remove the spacer material to allow the epitaxially grown region to extend to the surface of the STI region 76.

Further in FIGS. 6A, 6B, and 6C, an etch stop layer (ESL) 88 is conformally formed on epitaxial source/drain regions 84 and 86, gate spacers 82, masks 80, and isolation regions 74. In some embodiments, the ESL 88 may comprise silicon nitride, silicon carbonitride, or the like, formed using ALD, CVD, the like, or a combination thereof. A bottom interlayer dielectric (ILD) 90 is deposited over the ESL 88. ILD 90 may comprise Phospho-Silicate Glass (PSG), Boro-Silicate Glass (BSG), Boron-Doped Phospho-Silicate Glass (BPSG), undoped Silicate Glass (USG), or the like, and may be deposited by any suitable method, such as CVD, plasma-enhanced CVD (PECVD), FCVD, the like, or a combination thereof.

Figure 7:
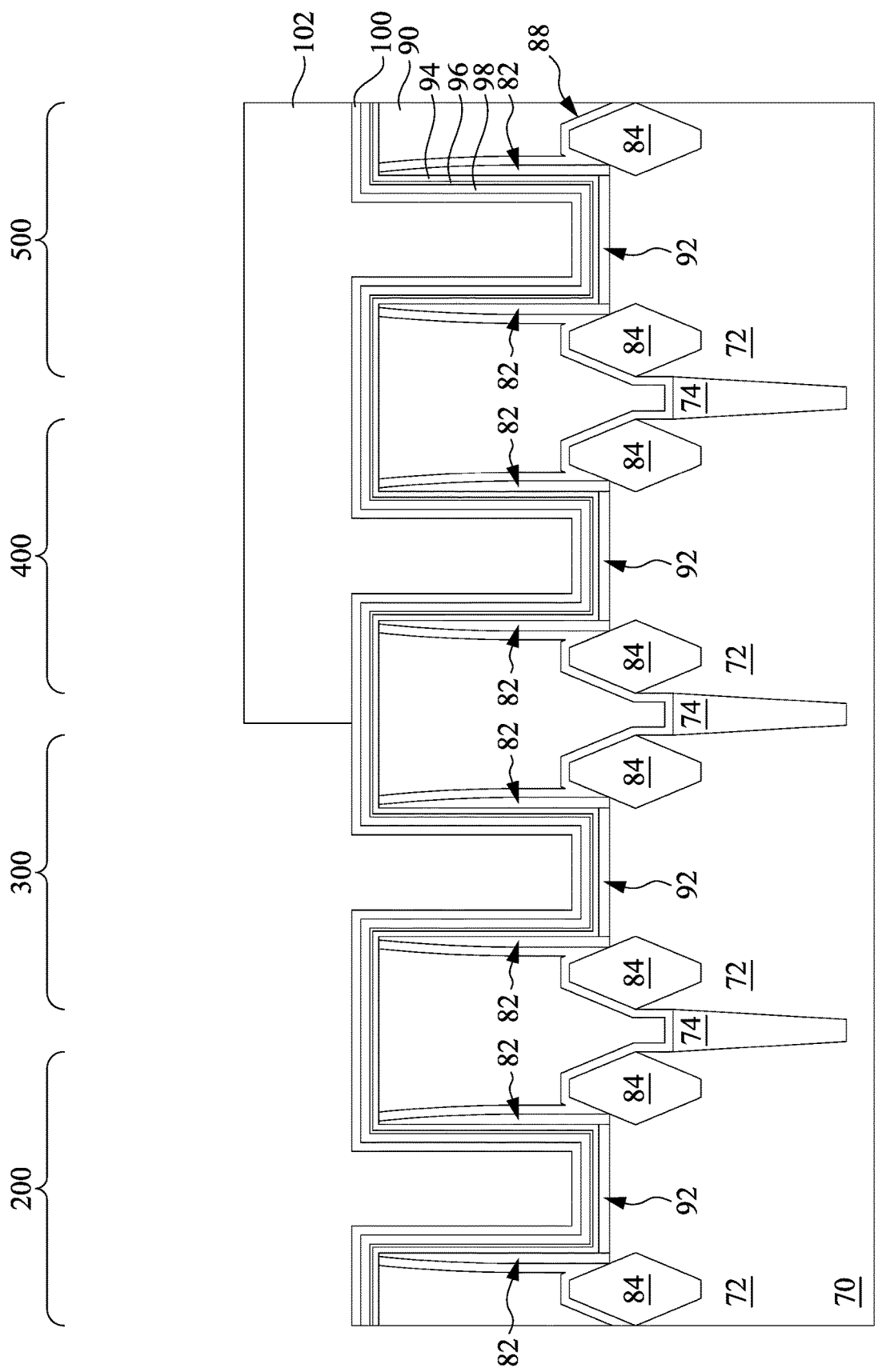

In FIG. 7, a planarization process, such as a CMP, is performed to level the top surface of ILD 90 with the top surfaces of the dummy gates 78. The CMP may also remove the masks 80 and the ESL 88 from over the dummy gates 78. Accordingly, top surfaces of the dummy gates 78 are exposed through the ILD 90. The dummy gates 78 and the dummy gate dielectrics 76 are removed in an etching step(s), so that openings through the ILD 90 and defined by the gate spacers 82 are formed to the fins 72. Each opening exposes a channel region of a respective fin 72. Each channel region is disposed between neighboring pairs of epitaxial source/drain regions 84 and 86. The etching step(s) may be selective to the materials of the dummy gates 78 and the dummy gate dielectrics 76, which etching may be a dry or wet etching. During the etching, the dummy gate dielectrics 76 may be used as an etch stop layer when the dummy gates 78 are etched. The dummy gate dielectric 76 may then be etched after the removal of the dummy gates 78. Although not specifically illustrated, depending on the similarity of materials used for the ILD 90 and the dummy gate dielectrics 76, the ILD 90 may be recessed when the dummy gate dielectrics 76 are removed, and this recessing may cause portions of the ESL 88 and/or gate spacers 82 to protrude above the top surface of the ILD 90.

An interfacial dielectric 92 is formed in each opening and on the fins 72. The interfacial dielectric 92 may be, for example, an oxide or the like formed by thermal oxidation, chemical oxidation, ALD, or the like. A thickness of the interfacial dielectric 92 may be in a range from about 0.7 nm to about 2 nm. In some embodiments, the dummy gate dielectric 76 is not completely removed from one or more of the openings, and a separate interfacial dielectric 92 need not be deposited in such openings. For example, remaining portions of the dummy gate dielectric 76 may be the interfacial dielectric 92.

A gate dielectric layer 94 is then formed conformally on the top surface of the ILD 90 and in the openings along sidewalls of the gate spacers 82 and on the interfacial dielectric 92. In some embodiments, the gate dielectric layer 94 comprises a high-k dielectric material, and in these embodiments, the gate dielectric layer 94 may have a k value greater than about 7.0, and may include a metal oxide or a silicate of Hf, Al, Zr, La, Mg, Ba, Ti, Pb, and combinations thereof. The formation methods of gate dielectric layer 94 may include ALD, CVD, Molecular-Beam Deposition (MBD), the like, or a combination thereof. A thickness of the gate dielectric layer 94 may be in a range from about 1.2 nm to about 3 nm. The gate dielectric layer 94 may have a different thickness in other embodiments.

A capping layer is then formed conformally on the gate dielectric layer 94. In the illustrated embodiment, the capping layer comprises a first conductive layer 96 and a second conductive layer 98. In some embodiments, the capping layer may be a single layer or may comprise additional conductive layers. The capping layer may function as a barrier layer to prevent a subsequently deposited metal-containing material from diffusing into the gate dielectric layer 94. Further, the second conductive layer 98, as illustrated, can function as an etch stop during the formation of work function tuning layers in various regions 200, 300, 400 and 500 if the first conductive layer 96 is formed from a same material as the work function tuning layers, as will become clearer subsequently. The first conductive layer 96 can comprise titanium nitride (TiN), titanium silicon nitride (ti-SiN), or the like deposited on the gate dielectric layer 94 by ALD, CVD, physical vapor deposition (PVD), or the like. The second conductive layer 98 can comprise tantalum nitride (TaN) or the like deposited on the first conductive layer 96 by ALD, CVD, PVD, or the like. A thickness of the capping layer may be in a range from about 0.7 nm to about 6 nm. In the illustrated embodiment, a thickness of the first conductive layer 96 may be in a range from about 0.7 nm to about 3 nm, and a thickness of the second conductive layer 98 may be in a range from about 1 nm to about 3 nm. Other thicknesses are also possible in other embodiments.

A first work function tuning layer 100 is then formed conformally on the capping layer, e.g., on the second conductive layer 98. The first work function tuning layer 100 may be any acceptable material to tune a work function of a device to a desired amount given the application of the device to be formed, and may be deposited using any acceptable deposition process. In some embodiments, the first work function tuning layer 100 is a p-type work function metal and may comprise titanium nitride (TiN) or the like deposited by ALD, CVD, PVD, or the like. A thickness of the first work function tuning layer 100 may be in a range from about 0.7 nm to about 2.5 nm. Other thicknesses are also possible in other embodiments.

Figure 8:
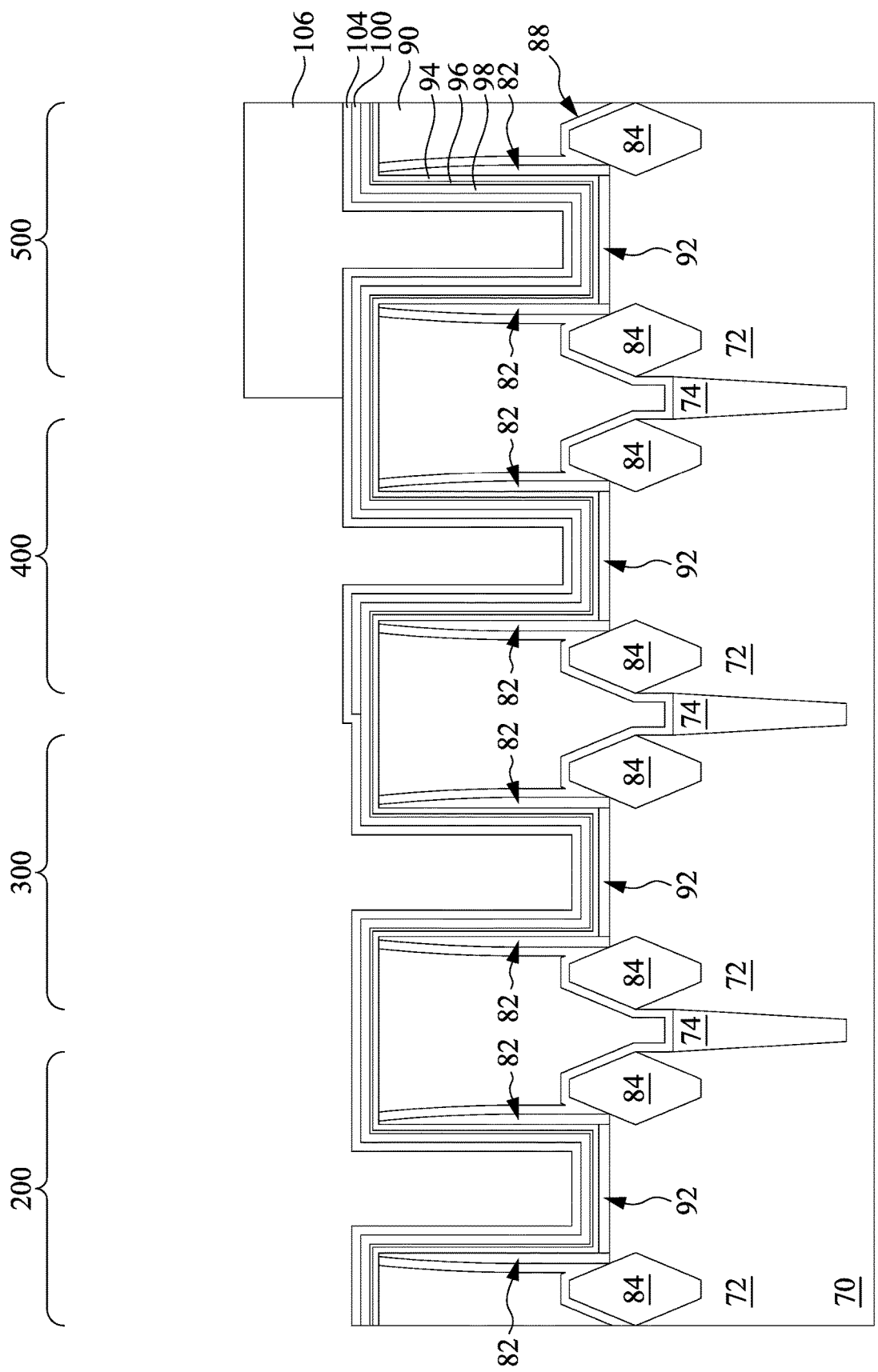

A mask 102 is then deposited and patterned over the first work function tuning layer 100. The mask layer 102 may cover the first work function tuning layer 100 in the third and fourth regions 400 and 500, while exposing the first work function tuning layer 100 in the first and second regions 200 and 300. In some embodiments, the mask 102 is a photo-resist formed by using a spin-on technique and can be patterned using acceptable photolithography techniques. Once the mask 102 is patterned, an etch selective to the first work function tuning layer 100 is performed to remove the first work function tuning layer 100 from the first and second regions 200 and 300, as illustrated in FIG. 8. The second conductive layer 98 in the first and second regions 200 and 300 may act as an etch stop during this etching. The mask 102 is then removed, such as by using an appropriate wet strip and/or ashing process if the mask 102 is a photoresist.

In FIG. 8, a second work function tuning layer 104 is then formed conformally on the capping layer, e.g., on the second conductive layer 98, in the first and second regions 200 and 300 and conformally on the first work function tuning layer 100 in the third and fourth regions 400 and 500. The second work function tuning layer 104 may be any acceptable material to tune a work function of a device to a desired amount given the application of the device to be formed, and may be deposited using any acceptable deposition process. In some embodiments, the second work function tuning layer 104 is a p-type work function metal and may comprise titanium nitride (TiN) or the like deposited by ALD, CVD, PVD, or the like. In some embodiments, the second work function tuning layer 104 may have a same or different material composition as the first work function tuning layer 100. In some embodiments, a bottom surface of the second work function tuning layer 104 may form an interface with a top surface of the first work function tuning layer 100. A thickness of the second work function tuning layer 104 may be in a range from about 0.7 nm to about 2.5 nm. Other thicknesses are also possible in other embodiments.

In some embodiments, a vacuum break may occur between forming the first work function tuning layer 100 and forming the second work function tuning layer 104. As a result, the first work function tuning layer 100 may be oxidized at its top surface. For example, a titanium oxynitride region may form at the top surface of the first work function tuning layer 100 due to exposure of the top surface of the first work function tuning layer 100 to an oxygen-comprising ambient. In such embodiments, this oxidized region (e.g., titanium oxynitride region) may be deposed at the interface between the first work function tuning layer 100 and the second work function tuning layer 104.

Figure 9:
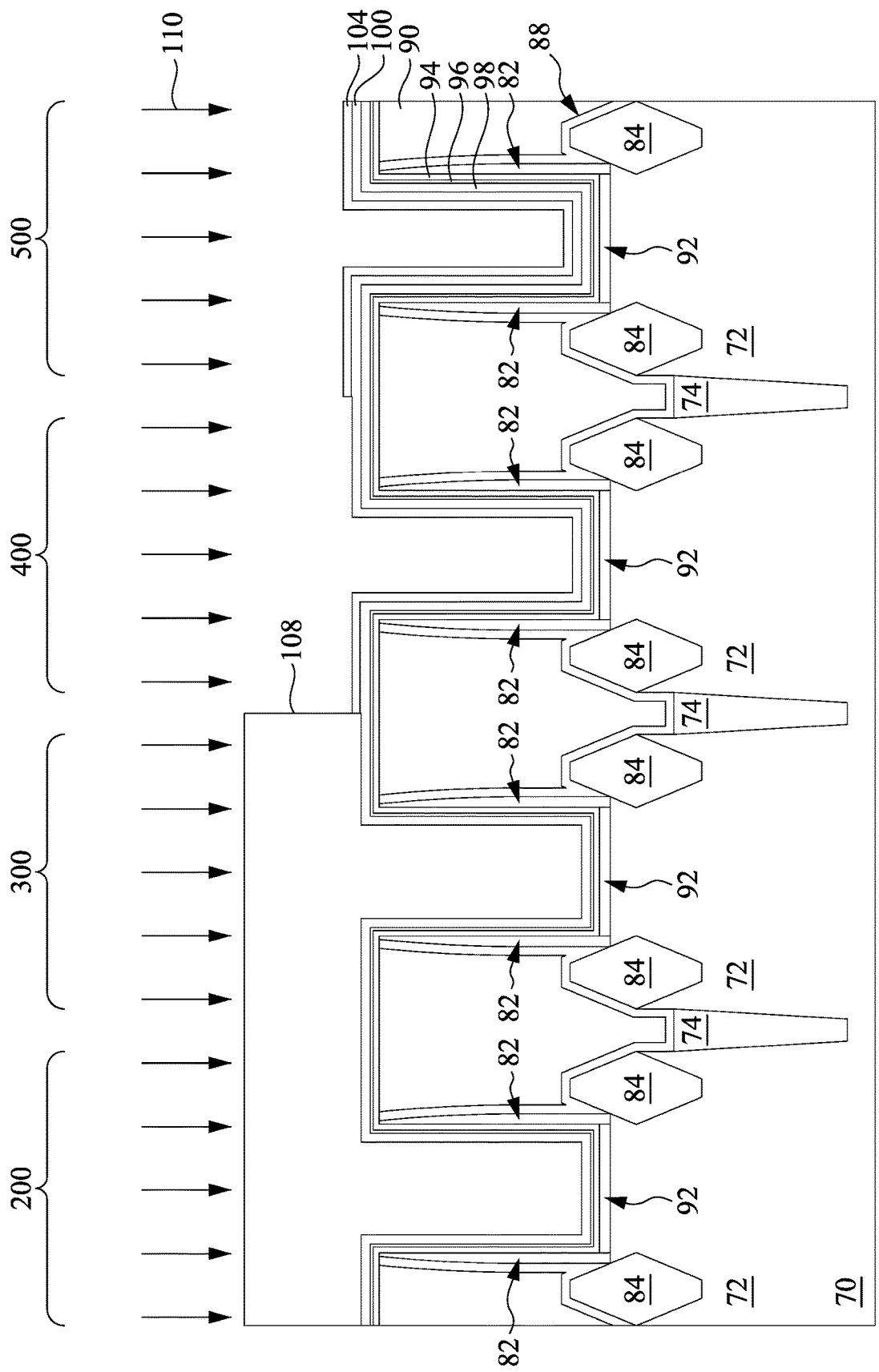

A mask 106 is then deposited and patterned over the second work function tuning layer 104. The mask 106 may cover the second work function in the fourth region 500 while exposing the second work function tuning layer 104 in the first, second and third regions 200, 300 and 400. In some embodiments, the mask 106 is a photoresist formed by using a spin-on technique and can be patterned using acceptable photolithography techniques. Once the mask 106 is patterned, an etch is performed to remove the second work function tuning layer 104 from the first, second and third regions 200, 300 and 400, as illustrated in FIG. 9. In some embodiments, a timed and/or selective etching process may be performed so that only the second work function tuning layer 104 is substantially removed in the first, second and third regions 200, 300, and 400 without significantly removing the underlying layers (e.g., the second conductive layer 98 and the first work function tuning layer 100) in these regions. The mask 106 is then removed, such as by using an appropriate wet strip and/or ashing process if the mask 106 is a photoresist.

By using the processes described in FIGS. 6 through 9, one or more the p-type work function tuning layers may be formed in each of regions 200, 300, 400, and 500 to a desired cumulative thickness (e.g., a thickness of the first work function tuning layer 100 and/or the second work function tuning layer 104 in each opening), and transistors with different threshold voltages may be formed in each of the regions 200, 300, 400, and 500.

As further illustrated in FIG. 9, a mask 108 is then deposited and patterned over the second conductive layer 98, the first work function tuning layer 100, and the second work function tuning layer 104. The mask 108 covers the second conductive layer 90 in the first and second regions 200 and 300, while exposing the first work function metal layer in the third region 400 and exposing the second work function tuning layer 104 in the fourth region 500. In some embodiments, the mask 108 is a photoresist, which can be formed by using a spin-on technique and can be patterned using acceptable photolithography techniques.

Once the mask 108 is patterned, a doping process 110 is performed to dope exposed portions of the first work function tuning layer 100 (e.g., portions of the first work function tuning layer 100 in the third region 400) and exposed portions of the second work function tuning layer 104 (e.g., portions of the second work function tuning layer 104 in the fourth region 500). The doping process 110 may include doping exposed portions of the first work function tuning layer 100 and the second work function tuning layer 104 with silicon. In an embodiment, the doping process 110 is an ALD process using $SiH_4$ or the like as the doping gas. A silicon concentration of the doping gas used in the doping process 110 may be in a range of about 5% to about 25%. In some embodiments, the doping process 110 may be performed at a temperature in a range of about 250° C. to about 475° C.; for a duration about 1 s to about 10 min; at a pressure of about 0.5 Torr to about 50 Torr; and using a carrier gas such as Ar or the like. In other embodiments, the doping process 110 may be performed using one or more different process conditions as those described above.

As a result of the doping process 110, the first work function tuning layer 100 in the third region 400 and the second work function tuning layer 104 in the fourth region 500 may each comprise silicon. For example, the first work function tuning layer 100 in the third region 400 and the second work function tuning layer 104 in the fourth region 500 may comprise titanium silicon nitride or the like. A concentration of silicon in the first work function tuning layer 100 in the third region 400 may be in a range of about 0.5% to about 10%, and a concentration of silicon in the second work function tuning layer 104 in the fourth region 500 may be in a range of about 0.5% to about 10%. It has been observed that by doping the first and second work function tuning layers 100/104 to have silicon in the above ranges, a desired etch selectivity can be achieved. Further, portions of the first work function tuning layer 100 in the fourth region 500 may be masked by the second work function tuning layer 104 during the doping process 110, and the first work function tuning layer 100 in the fourth region 500 may be substantially undoped and free of silicon. Alternatively, silicon may diffuse from the second work function tuning layer 104 into the underlying first work function tuning layer 100 in the fourth region 500, and as a result, the first work function tuning layer 100 in the fourth region 500 may also comprise silicon. In such embodiments, the first work function tuning layer 100 in the fourth region 500 may have a lower concentration of silicon than the first work function tuning layer 100 in the third region 400. The diffusion of silicon into the first work function tuning layer 100 in the fourth region 500 may be enhanced by one or more annealing processes that are performed subsequent to the doping process 110. In such embodiments, the second conductive layer 98 may act as a diffusion barrier layer that blocks significant diffusion of silicon into the underlying layers.

Figure 10:
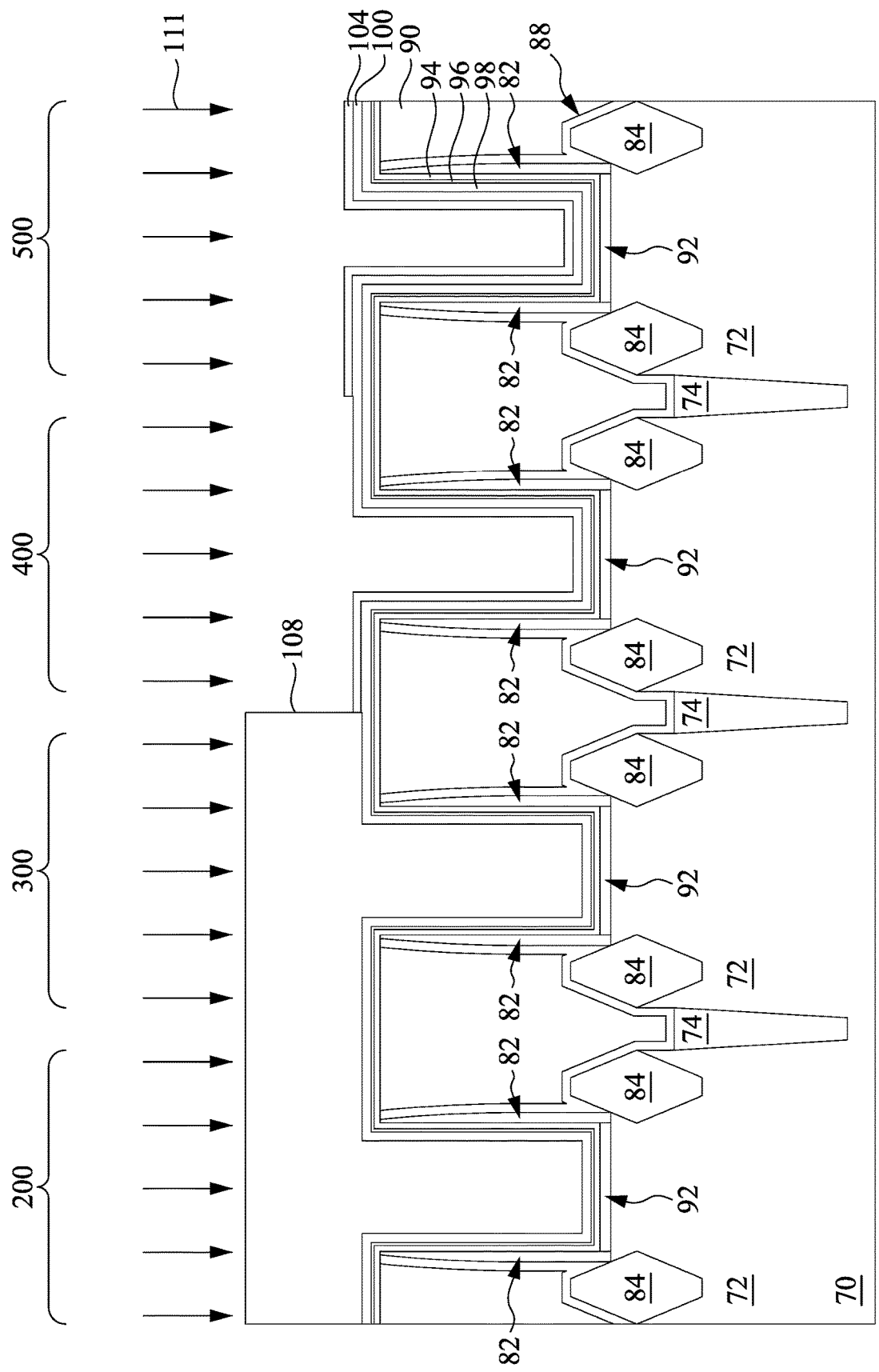

In another embodiment, the doping process 110 may be replaced with a different doping process. For example, FIG. 10 illustrates an alternate embodiment where a doping process 111 is performed on the first work function tuning layer 100 and the second work function tuning layer 104 instead of the doping process 110. The doping process 111 may include doping exposed portions of the first work function tuning layer 100 (e.g., portions of the first work function tuning layer 100 in the third region 400) and exposed portions of the second work function tuning layer 104 (e.g., portions of the second work function tuning layer 104 in the fourth region 500) with aluminum. In an embodiment, the doping process 111 is an ALD process using $AlCl_3$, trimethylaluminum (TMA), or the like as the doping gas. An aluminum concentration of the doping gas used in the doping process 111 may be in a range of about 5% to about 25%. In some embodiments, the doping process 111 may be performed at a temperature in a range of about 250° C. to about 475° C.; for a duration about 1s to about 10 min; at a pressure of about 0.5 Torr to about 50 Torr; and using a carrier gas such as Ar or the like. In other embodiments, the doping process 111 may be performed using one or more different process conditions as those described above.

As a result of the doping process 111, the first work function tuning layer 100 in the third region 400 and the second work function tuning layer 104 in the fourth region 500 may each comprise aluminum. For example, the first work function tuning layer 100 in the third region 400 and the second work function tuning layer 104 in the fourth region 500 may comprise titanium aluminum nitride or the like. A concentration of aluminum in the first work function tuning layer 100 in the third region 400 may be in a range of about 2.5% to about 40%, and a concentration of aluminum in the second work function tuning layer 104 in the fourth region 500 may be in a range of about 2.5% to about 40%. It has been observed that by doping the first and second work function tuning layers 100/104 to have aluminum in the above ranges, a desired etch selectivity can be achieved. Further, portions of the first work function tuning layer 100 in the fourth region 500 may be masked by the second work function tuning layer 104 during the doping process 111, and the first work function tuning layer 100 in the fourth region 500 may be substantially undoped and free of aluminum. Alternatively, aluminum may diffuse from the second work function tuning layer 104 into the underlying first work function tuning layer 100 in the fourth region 500, and as a result, the first work function tuning layer 100 in the fourth region 500 may also comprise aluminum. In such embodiments, the first work function tuning layer 100 in the fourth region 500 may have a lower concentration of aluminum than the first work function tuning layer 100 in the third region 400. The diffusion of the aluminum may be enhanced by one or more annealing processes that are performed subsequent to the doping process 111. In such embodiments, the second conductive layer 98 may act as a diffusion barrier layer that blocks significant diffusion of aluminum into the underlying layers.

Subsequent to the doping process 110 or 111, the mask 108 may be removed by using an appropriate wet strip and/or ashing process if the mask 108 is a photoresist. In some embodiments, a terminating species, such as hydroxide and/or oxygen, can terminate the surfaces of the second conductive layer 98, the first work function tuning layer 100 and the second work function tuning layer 104 as a result of the doping process 110 or 111, the removal of the mask 108, and/or exposure to an oxygen-containing ambient, such as a natural environment. The species, when hydroxide and/or oxygen, can form an oxide, such as a native oxide, on these layers 98, 100 and 104. As a result, exposed portions of the first work function tuning layer 100 and the second work function tuning layer 104 may oxidize and comprise titanium silicon oxynitride or the like. Specifically, the oxidation may result in silicon-oxygen bonds (e.g., $Si_xO_y$) or aluminum-oxygen ($Al_xO_y$) being formed in the first work function tuning layer 100 in the third region 400 and in the second work function tuning layer 104 in the fourth region 500. By including $Si_xO_y$ in the gate electrodes, flat band voltage ($V_{FB}$) of the resulting transistor may be improved. Further, as will be explained in greater detail below, by doping portions of the first work function tuning layer 100 and the second work function tuning layer 104 with silicon, aluminum, and/or oxygen, an etch selectivity between the first conductive layer 98 (e.g., comprising tantalum nitride) and the first and second work function tuning layers 100 and 104 (e.g., comprising titanium, silicon, and nitrogen) may be increased, improving process control and allowing different transistors with a greater threshold voltage differential to be formed in different regions of the device.

Figure 11:
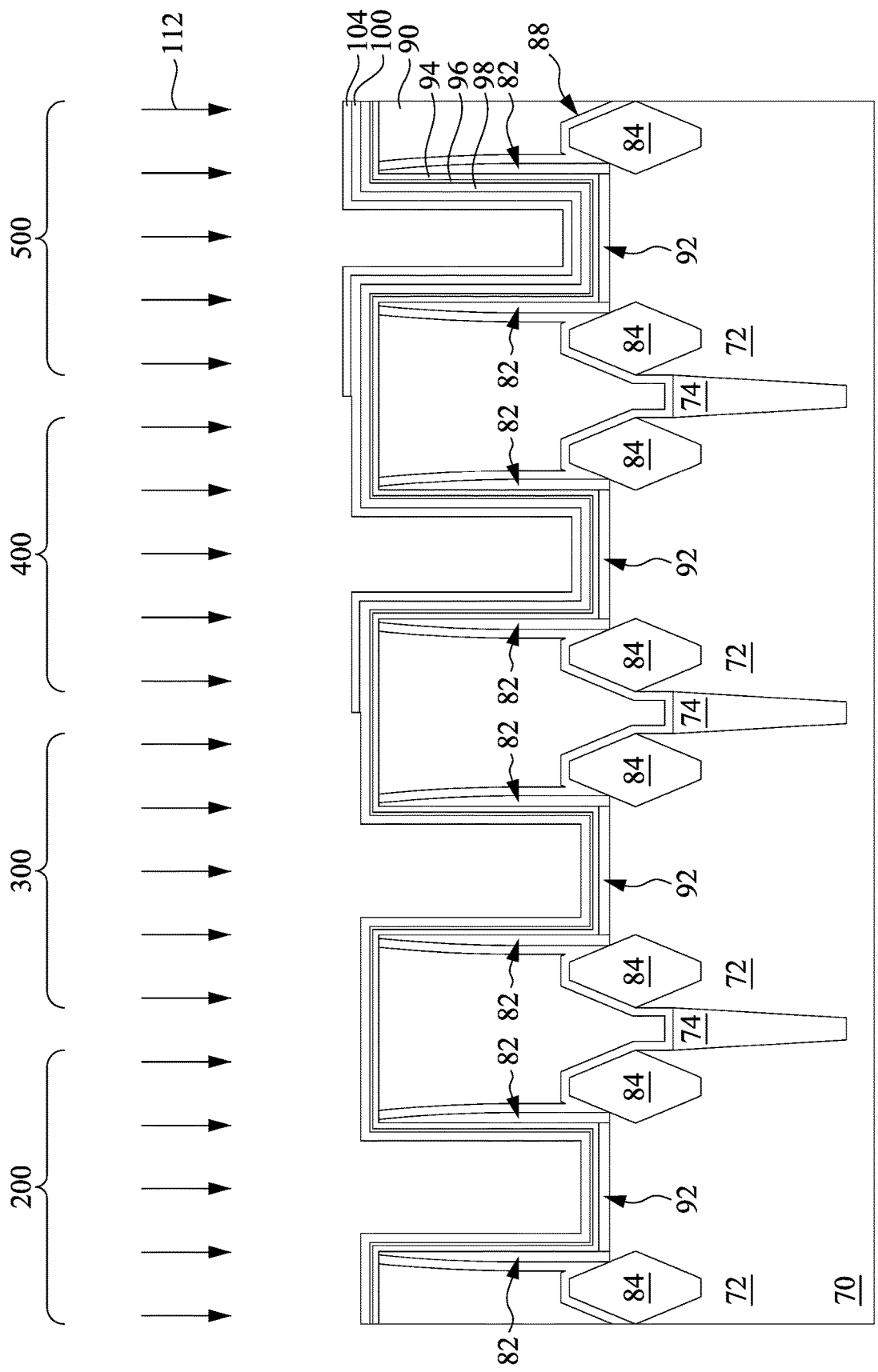

Next, in FIG. 11, a chlorine-based treatment 112 is performed on the top surfaces of the second conductive layer 98, the first work function tuning layer 100, and the second work function tuning layer 104. In some embodiments, the chlorine-based treatment 112 includes exposing the top surfaces of the second conductive layer 98, the first work function tuning layer 100, and the second work function tuning layer 104 to a chlorine-based fluid. The chlorine-based fluid can further be a metal-chlorine fluid, such as $TiCl_x$, $TaCl_x$, $WCl_x$, the like, or a combination thereof. In some embodiments, the chlorine-based fluid, and more particularly, the metal-chlorine fluid, is a gas. The chlorine-based gas, or metal-chlorine gas, can be used in the treatment without using a plasma. In some embodiments, the top surfaces of the second conductive layer 98, the first work function tuning layer 100, and the second work function tuning layer 104 are exposed to a chlorine-based gas, e.g., $WCL_5$, thermal soak, for example, at a temperature a temperature in a range from about 200° C. to about 600° C., with a flow rate of the chlorine-based gas being in a range from about 100 sccm to about 10,000 sccm for a duration in a range from about 10 sec to about 300 sec, such as about 30 sec to about 120 sec.

The chlorine-based treatment 112 can remove or strip the terminating species from the top surfaces of the second conductive layer 98, the first work function tuning layer 100 and the second work function tuning layer 104, and a chlorine-based species, such as chlorine (Cl), can re-terminate the top surfaces of the second conductive layer 98, the first work function tuning layer 100 and the second work function tuning layer 104. The chlorine-based treatment 112 may also etch the top surfaces of the exposed layers (e.g., the second conductive layer 98, the first work function tuning layer 100, and the second work function tuning layer 104). For example, a thickness of the second conductive layer 98 in the first region 200 and the second region 300 may less than a thickness of the second conductive layer 98 in the third region 400 and the fourth region 500. Further, a thickness of the first work function tuning layer 100 in the third region 400 may be less than a thickness of the first work function tuning layer 100 in the fourth region 500. By adjusting a thickness of the second conductive layer 98, the first work function tuning layer 100, and the second work function tuning layer 104, threshold voltages of transistors formed in each of the first, second, third, and fourth regions 200, 300, 400, and 500 may be adjusted. For example, a smaller cumulative thickness of the conductive layer 98, first work function tuning layer 100, and/or second work function tuning layer 104 may correspond to a lower threshold voltage.

In some embodiments, however, the chlorine-based treatment 112 will not significantly etch the treated first work function tuning layer 100 and second work function tuning layer 104 due to the presence of the oxygen bonded dopants (e.g., silicon or aluminum) in the treated first work function tuning layer 100 and second work function tuning layer 104. For example, the chlorine-based treatment 112 may not significantly etch the treated first and second work function tuning layers 100 and layer 104 due to the presence of $Si_xO_y$ or $Al_xO_y$. Thus, the second conductive layer 98 will be etched more significantly and at a greater rate by the chlorine-based treatment 112 than the first work function tuning layer 100 or the second work function tuning layer 104. For example, an etch thickness of the first work function tuning layer 100 and the second work function tuning layer 104 (e.g., respective thicknesses of the first work function tuning layer 100 and the second work function tuning layer 104 that is etched away by the chlorine-based treatment 112) is less than an etch thickness of the second conductive layer 98 (e.g., thicknesses of the second conductive layer 98 that is etched away by the chlorine-based treatment 112). In some embodiments, the etch thickness of the first and second work function tuning layers 100 and 104 may be about 1 Å or less. In some embodiments, the etch thickness of the first work function tuning layer 100 and the second work function tuning layer 104 may be less than half of an etch thickness of a similar work function tuning layer that was not doped according to the doping processes 110/111 described above. Accordingly, the doping processes 110 and 111 may increase an etch selectivity of the first conductive layer 98 compared to the treated first and second work function tuning layers 100 and 104. For example, a ratio of an etch thickness of the first conductive layer 98 to an etch thickness of the first and second work function tuning layers 100 and 104 may be increased. By increasing the etch selectivity of these layers, increased threshold voltage separation of the different transistors in the different regions 200, 300, 400, and 500 may be increased. Specifically, a lower threshold voltage can be achieved for transistors in the first and second regions 200 and 300 while maintaining a higher threshold voltage for transistors in the third and fourth regions 400 and 500. Various embodiments allow for greater threshold voltage separation flexibility during the replacement metal gate process.

Figure 12:
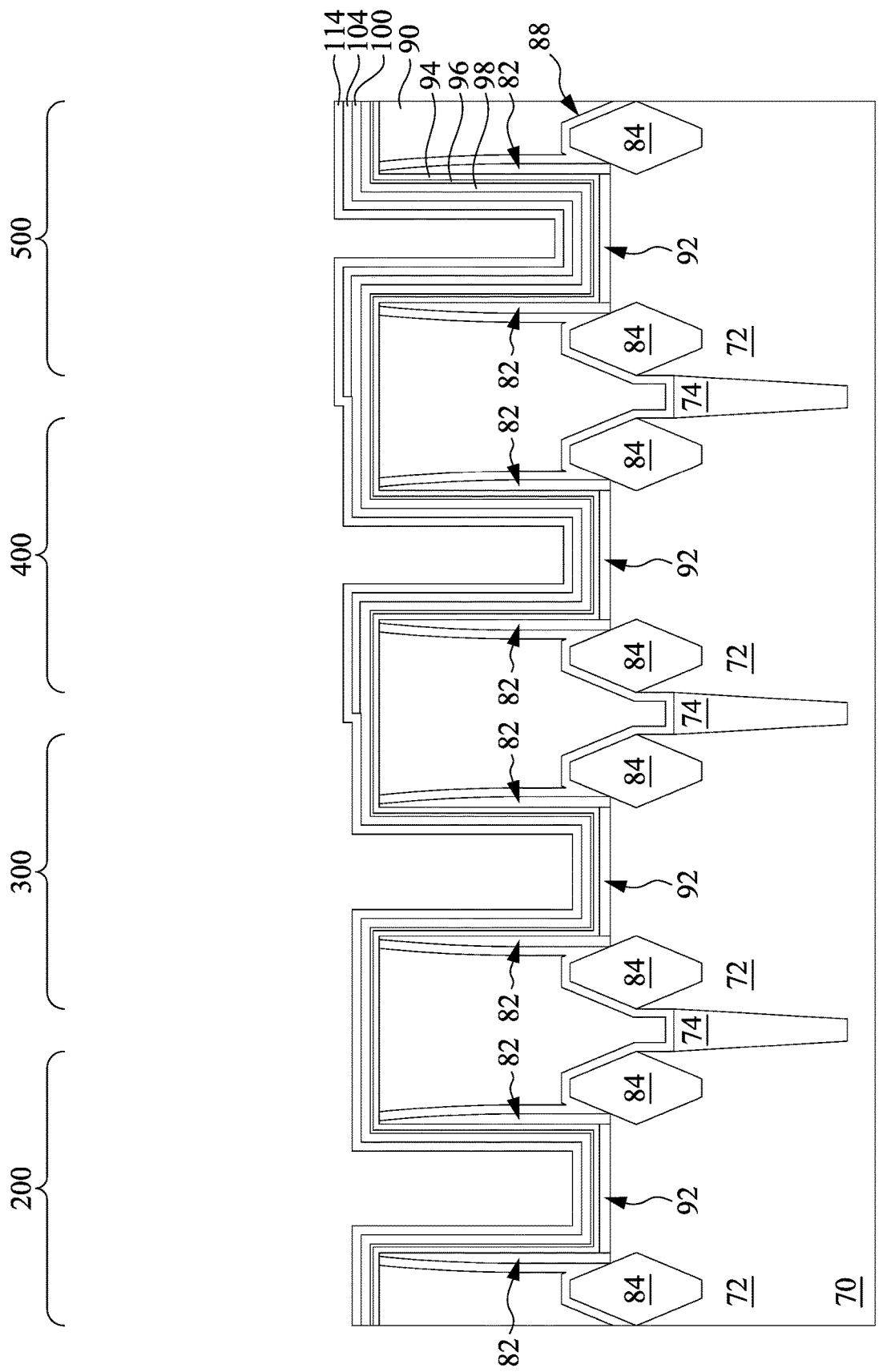

In FIG. 12, following the chlorine-based treatment 112, a third work function tuning layer 114 is then formed conformally on the second conductive layer 98, in the first and second regions 200 and 300, conformally on the first work function tuning layer 100 in the third region 400, and conformally on the second work function tuning layer 104 in the fourth region 500. The third work function tuning layer 114 may be any acceptable material to tune a work function of a device to a desired amount given the application of the device to be formed, and may be deposited using any acceptable deposition process. In some embodiments, the second work function tuning layer 104 is a n-type work function metal and may comprise aluminum (Al), aluminum nitride (AlN), titanium aluminum (TiAl), tantalum aluminum (TaAl), or the like deposited by ALD, CVD, PVD, or the like. A thickness of the third work function tuning layer 114 may be in a range from about 1.5 nm to about 4 nm.

Figure 13:
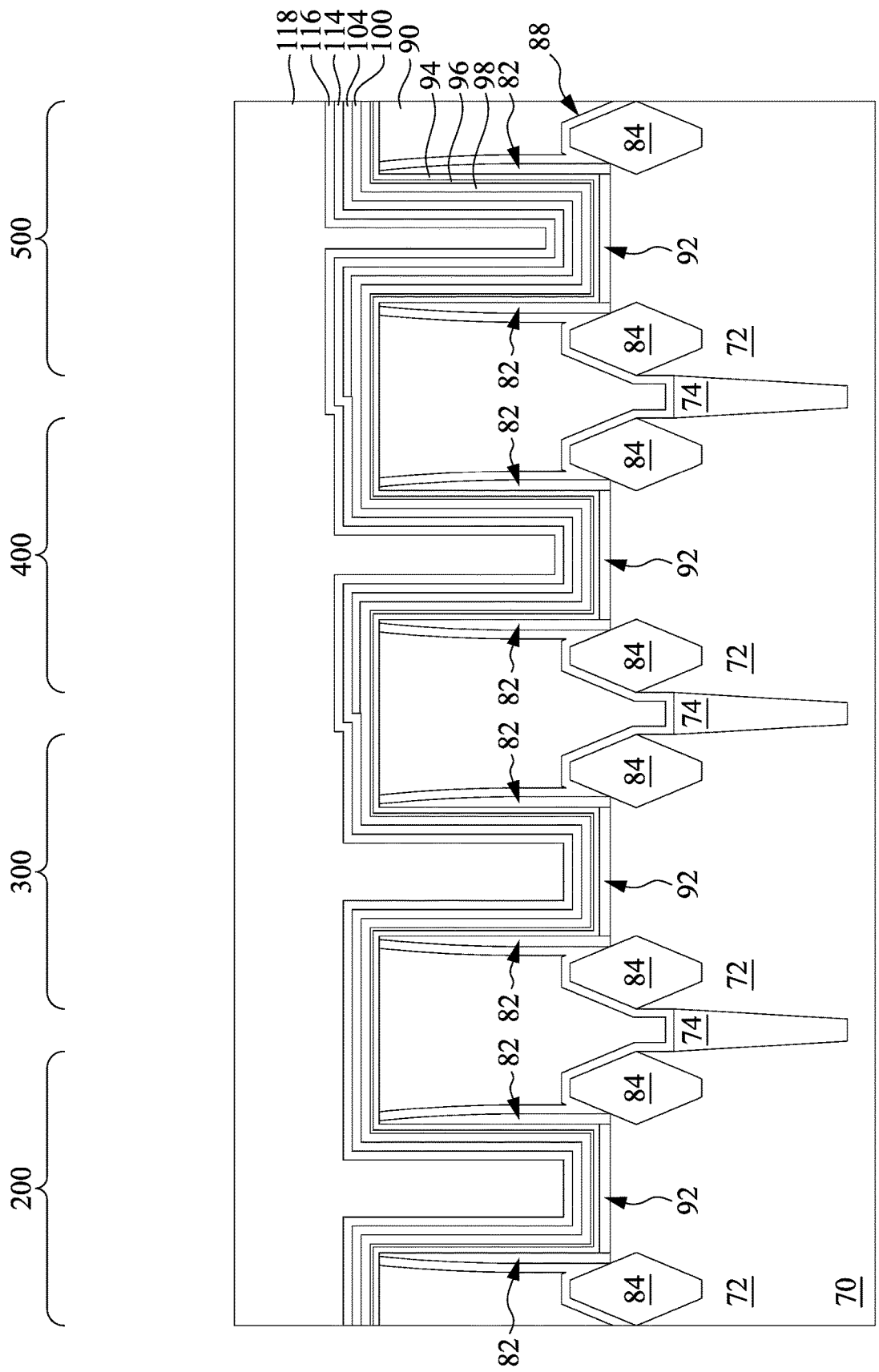

In FIG. 13, an adhesion or glue layer 116 is formed conformally on the third work function tuning layer 114 in first, second, third and fourth regions 200, 300, 400 and 500. The glue layer 116 may comprise titanium nitride (TiN) or the like deposited by ALD or the like. A thickness of the glue layer 116 may be in a range from about 2 nm to about 4 nm.

Also in FIG. 13, a conductive material 118 is deposited on the glue layer 116. The conductive material 118 can include a metal, such as tungsten (W), aluminum (Al), cobalt (Co), ruthenium (Ru), combinations thereof or the like. The conductive material 118 can be deposited using CVD, PVD, the like, or a combination thereof. The conductive material 118 at least fills the remaining portions, e.g., portions not filled by the first conductive layer 96, the second conductive layer 98, the first work function tuning layer 100, the second work function tuning layer 104, the third work function tuning layer 114, and the glue layer 116, of the openings.

Figure 14:
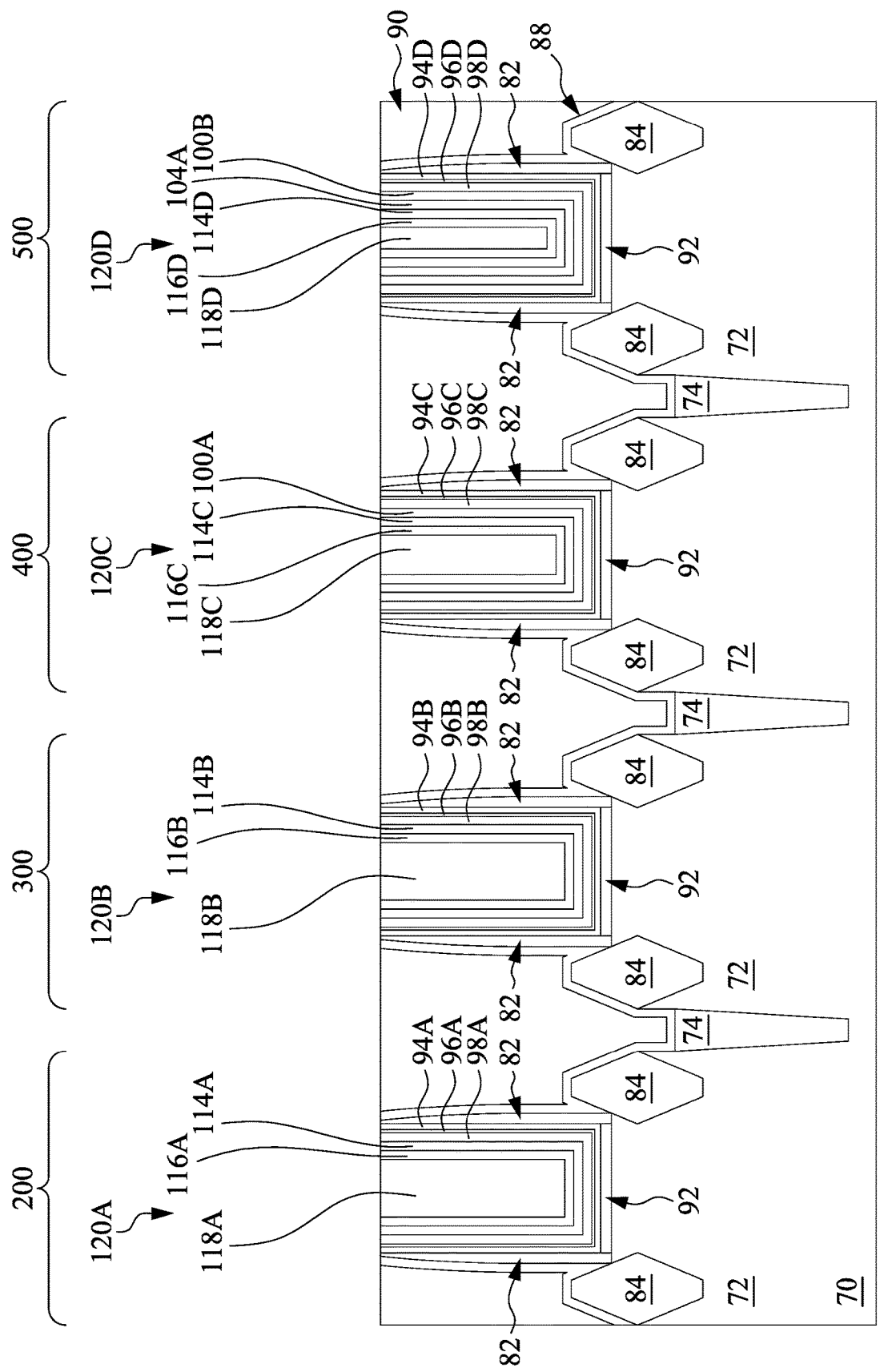

Next, as illustrated in FIG. 14, a planarization process, such as a CMP, may be performed to remove the excess portions of the first conductive layer 96, the second conductive layer 98, the first work function tuning layer 100, the second work function tuning layer 104, the third work function tuning layer 114, the glue layer 116, and the conductive material 118, which excess portions are over the top surface of ILD 90, to form gate dielectric materials 94A, 94B, 94C, and 94D (e.g., from remaining portions of the gate dielectric layer 94, see FIG. 13) and gate electrodes 120A, 120B, 120C, and 120D (comprising remaining portions of the first conductive layer 96, the second conductive layer 98, the first work function tuning layer 100 in the third and fourth regions 400 and 500, the second work function tuning layer 104 in the fourth region 500, the third work function tuning layer 114, the glue layer 116, and the conductive material 118, see FIG. 13) in the first, second, third, and fourth regions 200, 300, 400, and 500 respectively. Specifically, the first gate electrode 120A in the first region 200 comprises a conductive material 96A, a conductive material 98A, a work function tuning metal 114A, a glue material 116A, and a fill metal 118A. The second gate electrode 120B in the second region 300 comprises a conductive material 96B, a conductive material 9BA, a work function tuning metal 114B, a glue material 116B, and a fill metal 118B. The third gate electrode 120C in the third region 400 comprises a conductive material 96C, a conductive material 98C, a work function tuning metal 100A, a work function tuning metal 114C, a glue material 116C, and a fill metal 118C. The fourth gate electrode 120D in the fourth region 500 comprises a conductive material 96D, a conductive material 98D, a work function tuning metal 100B, a work function tuning metal 104A, a work function tuning metal 114D, a glue material 116D, and a fill metal 118D. The conductive materials 96A, 96B, 96C, and 96D may be formed of remaining portions of the first conductive layer 96; conductive materials 98A, 98B, 98C, and 98D may be formed of remaining portions of the second conductive layer 98; the work function metals 100A and 100B may be formed of remaining portions of the first work function tuning layer 100; the work function metal 104A may be formed of remaining portions of the second work function tuning layer 104; the work function metals 114A, 114B, 114C, and 114B may be formed of remaining portions of the third work function tuning layer 114; the glue materials 116A, 116B, 116C, and 116D may be formed of remaining portions of the glue layer 116; and the fill metals 118A, 118B, 118C, and 118D may be formed of remaining portions of the fill metal 118. As a result of the previously described processing steps, the conductive materials 98A and 98B may be thinner than the conductive materials 98C and 98D, and the work function tuning metal 100B is thinner than the work function tuning metal 100A. Accordingly, threshold voltages of transistors comprising the first and second electrodes 120A and 120B may be less than a threshold voltage of a transistor comprising the third electrode 120C, and the threshold voltage of the transistor comprising the third electrode 120C may be less than a threshold voltage of a transistor comprising the fourth electrode 120D. For ease of reference, the gate electrodes 120A, 120B, 120C, and 120D may be referred to as gate electrodes 120 hereinafter.

Figure 15A:
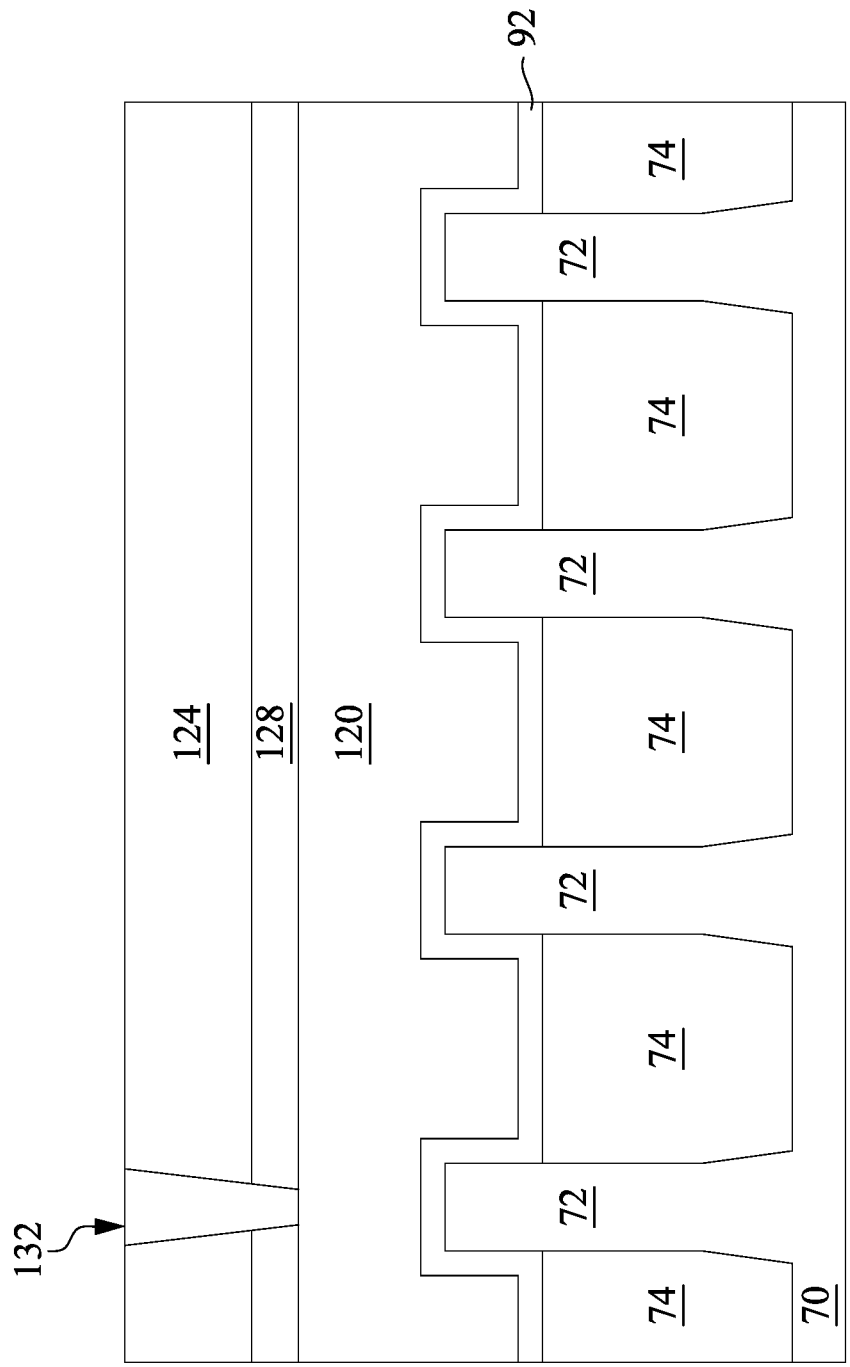
Figure 15B:
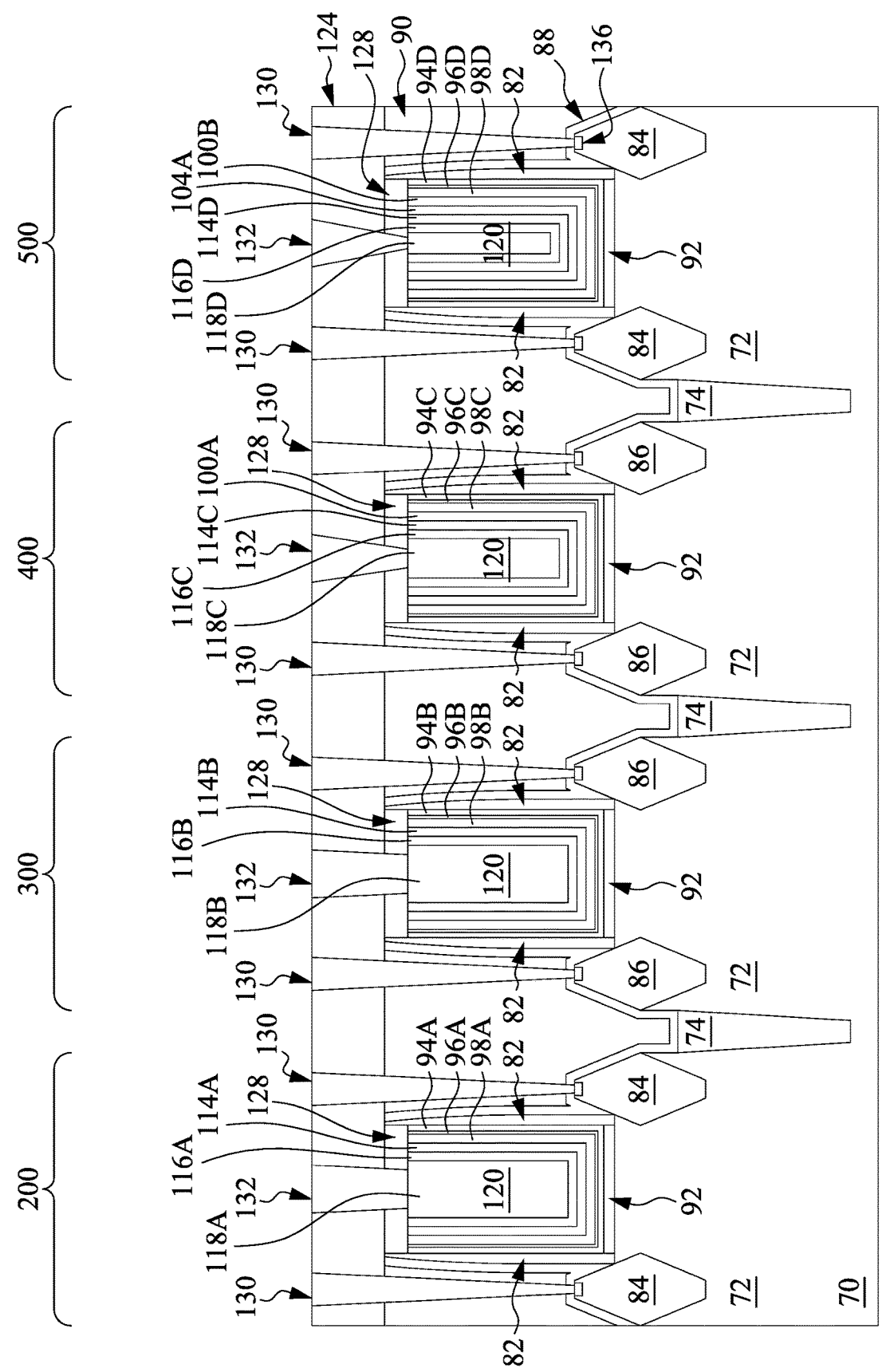
Figure 15C:
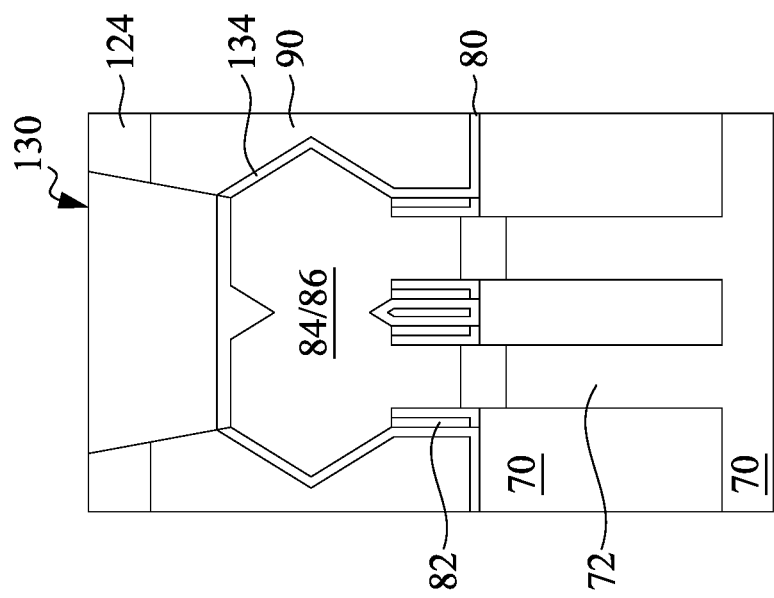

In FIGS. 15A, 15B, and 15C, a gate mask 128 is formed over the gate stack (including a gate dielectric layer 94 and a corresponding gate electrodes 120), and the gate mask 128 may be disposed between opposing portions of the gate spacers 82. In some embodiments, forming the gate mask 128 includes recessing the gate stack so that a recess is formed directly over the gate stack and between opposing portions of gate spacers 82. A gate mask 128 comprising one or more layers of dielectric material, such as silicon nitride, silicon oxynitride, or the like, is filled in the recess, followed by a planarization process to remove excess portions of the dielectric material extending over the first ILD 90.

As also illustrated in 15A, 15B, and 15C, a second ILD 124 is deposited over the ILD 90. In some embodiments, the second ILD 124 is a flowable film formed by a flowable CVD method. In some embodiments, the second ILD 124 is formed of a dielectric material such as PSG, BSG, BPSG, USG, or the like, and may be deposited by any suitable method, such as CVD and PECVD.

Gate contacts 132 and source/drain contacts 130 are formed through the second ILD 124 and the ILD 90 in accordance with some embodiments. Openings for the source/drain contacts 130 are formed through the ILDs 90 and 124, and openings for the gate contact 132 are formed through the ILD 124 and the gate mask 128. The openings may be formed using acceptable photolithography and etching techniques. A liner (not shown), such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the ILD 124. The remaining liner and conductive material form the source/drain contacts 130 and gate contacts 132 in the openings. An anneal process may be performed to form a silicide 136 at the interface between the epitaxial source/drain regions 84/86 and the source/drain contacts 130. The source/drain contacts 130 are physically and electrically coupled to the epitaxial source/drain regions 84/86, and the gate contacts 132 are physically and electrically coupled to the gate electrodes 120. The source/drain contacts 130 and gate contacts 132 may be formed in different processes, or may be formed in the same process. Although shown as being formed in the same cross-sections, it should be appreciated that each of the source/drain contacts 130 and gate contacts 132 may be formed in different cross-sections, which may avoid shorting of the contacts.

Although not explicitly shown, a person having ordinary skill in the art will readily understand that further processing steps may be performed on the structure in FIG. 13. For example, various Inter-Metal Dielectrics (IMD) and their corresponding metallizations may be formed over the ILD 124.

Various embodiments provide a gate electrode with a doped work function tuning layer (e.g., a titanium nitride layer). The work function tuning layer may be doped with, for example, silicon, aluminum, or the like, and the work function tuning layer may further include oxygen bonded to the dopant (e.g., $Si_xO_y$, $Al_xO_y$, or the like). By adjusting the composition of the work function tuning layer, etch selectivity between the work function tuning layer and an underlying layer (e.g., a tantalum nitride layer) maybe increased during a chlorine-based treatment that reduces thicknesses of the underlying layer for threshold voltage tuning. In this manner, a greater differential between threshold voltages of different transistors in the device can be achieved.

In some embodiments, a method includes depositing a first conductive layer over a gate dielectric layer; depositing a first work function tuning layer over the first conductive layer; selectively removing the first work function tuning layer from over a first region of the first conductive layer; doping the first work function tuning layer with a dopant; and after doping the first work function tuning layer performing a first treatment process to etch the first region of the first conductive layer and a second region of the first work function tuning layer. The first treatment process etches the first conductive layer at a greater rate than the first work function tuning layer. Optionally in some embodiments, the dopant is silicon or aluminum. Optionally in some embodiments, doping the first work function tuning layer with the dopant comprises an atomic layer deposition process. Optionally in some embodiments, the atomic layer deposition process comprises using $SiH_4$ as a doping gas. Optionally in some embodiments, the atomic layer deposition process comprises using $AlCl_3$ or trimethylaluminum (TMA) as a doping gas. Optionally in some embodiments, the method further includes depositing a second work function tuning layer over the first work function tuning layer; selectively removing the second work function tuning layer from over the second region of the first work function tuning layer; doping the second work function tuning layer with the dopant while doping the first work function tuning layer with the dopant; and performing the first treatment process to etch a third region of the second work function tuning layer, wherein the first treatment process etches the first conductive layer at a greater rate than the second work function tuning layer. Optionally in some embodiments, the first conductive layer comprises tantalum nitride, and the first work function tuning layer comprises titanium nitride. Optionally in some embodiments, the method further includes diffusing oxygen into the first work function tuning layer, wherein the oxygen bonds with the dopant. Optionally in some embodiments, the first treatment process is a chlorine-based etching process. Optionally in some embodiments, the chlorine-based etching process comprises a chlorine-based thermal soak. Optionally in some embodiments, the chlorine-based thermal soak comprises using $WCl_5$ as a process gas. Optionally in some embodiments, the method further includes depositing a third work function tuning layer over the first work function tuning layer after the first treatment process, wherein the first work function tuning layer is a p-type layer, and the third work function tuning layer is an n-type layer.

In some embodiments, a transistor includes a first source/drain region; a second source/drain region; and a gate between the first source/drain region and the second source/drain region, the gate comprising: a gate dielectric; and a gate electrode over the gate dielectric, the gate electrode comprising: a first conductive material; a first p-type work function tuning metal over the first conductive material, the first p-type work function tuning metal comprising silicon or aluminum; an n-type work function tuning metal over the first p-type work function tuning metal; and a fill metal over the n-type work function tuning metal. Optionally in some embodiments, the first p-type work function tuning metal comprises $Si_xO_y$ or $Al_xO_y$. Optionally in some embodiments, the gate electrode further comprises a second p-type work function tuning metal under the first p-type work function tuning metal, wherein the second p-type work function tuning metal comprises a lower concentration of silicon or aluminum than the first p-type work function tuning metal. Optionally in some embodiments, the first conductive material comprises titanium nitride, and wherein the first p-type work function tuning metal comprises titanium nitride.

In some embodiments, a device includes a first gate electrode, the first gate electrode comprising: a first conductive material over a first gate dielectric; a first n-type work function tuning metal contacting the first conductive material; and a first fill material over the first n-type work function tuning metal; and a second gate electrode, the second gate electrode comprising: a second conductive material over a second gate dielectric metal, the first conductive material being thinner than the second conductive material; a first p-type work function tuning metal contacting the second conductive material, first p-type work function tuning metal comprising silicon or aluminum; a second n-type work function tuning metal contacting the first p-type work function tuning metal; and a second fill material over the second n-type work function tuning metal. Optionally in some embodiments, the device further comprises a third gate electrode, the third gate electrode comprising: a third conductive material over a third gate dielectric metal, the third conductive material having a same material composition as the first conductive material, the first conductive material being thinner than the third conductive material; a second p-type work function tuning metal contacting the third conductive material, the first p-type work function tuning metal being thinner than the second p-type work function tuning metal; a third p-type work function tuning metal contacting the second p-type work function tuning metal, the third p-type work function tuning metal comprising silicon or aluminum; a third n-type work function tuning metal contacting the third p-type work function tuning metal; and a third fill material over the third n-type work function tuning metal. Optionally in some embodiments, the first p-type work function tuning metal further comprises oxygen. Optionally in some embodiments, the first conductive material and the second conductive material each comprise tantalum nitride, wherein the first p-type work function tuning metal comprises titanium nitride.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a gate electrode, the method comprising:
    removing a first dummy gate and a second dummy gate to define a first opening and a second opening;
    depositing a first conductive layer in the first opening and the second opening;
    depositing a first work function tuning layer over the first conductive layer;
    selectively removing the first work function tuning layer from the first opening without removing the first work function tuning layer in the second opening, selectively removing the first work function tuning layer exposing the first conductive layer in the first opening;
    performing a treatment process on the first work function tuning layer; and
    after performing the treatment process on the first work function tuning layer, simultaneously etching the first conductive layer in the first opening and the first work function tuning layer in the second opening by etching the first conductive layer at a greater rate than the first work function tuning layer.

2. The method of claim 1, wherein performing the treatment process comprises doping the first work function tuning layer with silicon or aluminum.

3. The method of claim 2, wherein doping the first work function tuning layer with silicon or aluminum comprises an atomic layer deposition process.

4. The method of claim 3, wherein the atomic layer deposition process comprises using $SiH_4$ as a doping gas.

5. The method of claim 3, wherein the atomic layer deposition process comprises using $AlCl_3$ or trimethylaluminum (TMA) as a doping gas.

6. The method of claim 1 further comprising:
    removing a third dummy gate to define a third opening, wherein the first conductive layer and the first work function tuning layer are deposited in the third opening;
    depositing a second work function tuning layer over the first work function tuning layer;
    selectively removing the second work function tuning layer from over the first work function tuning layer in the second opening;
    performing the treatment process on the second work function tuning layer; and
    simultaneously etching the second work function tuning layer in the third opening while etching the first conductive layer in the first opening and the first work function tuning layer in the second opening by etching the first conductive layer at a greater rate than the second work function tuning layer.

7. The method of claim 1, wherein the first conductive layer comprises tantalum nitride, and the first work function tuning layer comprises titanium nitride.

8. The method of claim 1 further comprising diffusing oxygen into the first work function tuning layer after the treatment process.

9. The method of claim 1, wherein simultaneously etching the first conductive layer in the first opening and the first work function tuning layer in the second opening comprises a chlorine-based etching process.

10. The method of claim 9, wherein the chlorine-based etching process comprises a chlorine-based thermal soak using $WCl_5$ as a process gas.

11. The method of claim 1 further comprising depositing a third work function tuning layer over the first work function tuning layer, wherein the first work function tuning layer is a p-type layer, and the third work function tuning layer is an n-type layer.

12. A method for forming a gate electrode, the method comprising:
    depositing a first conductive layer over a gate dielectric layer;
    depositing a first work function tuning layer over the first conductive layer;
    selectively removing the first work function tuning layer from over a first region of the first conductive layer;
    doping the first work function tuning layer and the first conductive layer with a dopant, wherein a second region of the first conductive layer is doped through the first work function tuning layer; and
    performing a first treatment process to simultaneously etch the first region of the first conductive layer and the second region of the first work function tuning layer, wherein the first treatment process etches the first conductive layer at a greater rate than the first work function tuning layer.

13. The method of claim 12, wherein the dopant is silicon.

14. The method of claim 12, wherein the dopant is aluminum.

15. The method of claim 12, wherein performing the first treatment process comprises performing a chlorine-based etching process.

16. A method comprising:
    removing a first dummy gate and a second dummy gate to define a first opening and a second opening;
    depositing a gate dielectric in the first opening and the second opening;
    depositing a first p-type work function tuning layer in the first opening and the second opening over the gate dielectric;
    depositing a second p-type work function tuning layer in the first opening and the second opening over the first p-type work function tuning layer;

selectively removing the second p-type work function tuning layer from the first opening to expose a first portion of the first p-type work function tuning layer in the first opening without removing the second p-type work function tuning layer from the second opening;

performing a doping process on the first portion of the first p-type work function tuning layer and the second p-type work function tuning layer, wherein after the doping process, a second portion of the first p-type work function tuning layer in the second opening has a lower dopant concentration than the second p-type work function tuning layer; and depositing a fill metal over the first portion of the first p-type work function tuning layer in the first opening and the second p-type work function tuning layer in the second opening.

17. The method of claim 16, wherein performing the doping process comprises doping with silicon or aluminum.

18. The method of claim 16 further comprising:

removing a third dummy gate and a second dummy gate to define a third opening;

depositing the gate dielectric in the third opening;

depositing a conductive layer in the first opening, the second opening, and the third opening, wherein the first p-type work function tuning layer is deposited over the conductive layer;

selectively removing the first p-type work function tuning layer from the third opening to expose the conductive layer in the third opening without removing the first p-type work function tuning layer from the first opening and the second opening;

while performing the doping process, masking the conductive layer in the third opening with a mask; and after performing the doping process, removing the mask.

19. The method of claim 18 further comprising:

after removing the mask, performing a chlorine-based treatment on the conductive layer in the third opening, the first portion of the first p-type work function tuning layer in the first opening, and the second p-type work function tuning layer in the second opening.

20. The method of claim 19, wherein the chlorine-based treatment etches the conductive layer at a faster rate than the first p-type work function tuning layer and the second p-type work function tuning layer.

* * * * *